US012688881B2

(12) United States Patent
Lai et al.

(10) Patent No.: US 12,688,881 B2
(45) Date of Patent: Jul. 21, 2026

(54) THYRISTOR MEMORY CELL, THYRISTOR MEMORY ARRAY, AND METHOD FOR FABRICATING A THYRISTOR MEMORY ARRAY

(71) Applicant: TAIWAN SEMICONDUCTOR MANUFACTURING COMPANY, LTD., Hsinchu (TW)

(72) Inventors: Sheng-Chih Lai, Hsinchu (TW); Chen-Jun Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 429 days.

(21) Appl. No.: 18/349,013

(22) Filed: Jul. 7, 2023

(65) Prior Publication Data

US 2025/0014627 A1 Jan. 9, 2025

(51) Int. Cl.
*G11C 11/39* (2006.01)
*H10B 99/00* (2023.01)
*H10D 18/40* (2025.01)
*H10D 62/822* (2025.01)
*H10D 62/824* (2025.01)
(Continued)

(52) U.S. Cl.
CPC .............. *G11C 11/39* (2013.01); *H10B 99/20* (2023.02); *H10D 18/40* (2025.01); *H10D 62/822* (2025.01); *H10D 62/824* (2025.01); *H10D 84/0102* (2025.01); *H10D 84/60* (2025.01)

(58) Field of Classification Search
CPC ........... H10D 62/822; H10D 18/40–65; H10D 62/124–129; H10D 62/85; H10D 62/852;

H10D 80/00–20; H10D 86/201; H10D 86/03; H10D 88/00–101; H10D 18/00–80; H10D 18/211–241; H10B 99/20; G11C 11/39
See application file for complete search history.

(56) References Cited

U.S. PATENT DOCUMENTS

2011/0133149 A1* 6/2011 Sonehara ........... G11C 13/0002
257/3
2011/0205782 A1* 8/2011 Costa ..................... G11C 14/00
365/148
2021/0335798 A1* 10/2021 Lee ......................... H10B 41/35

* cited by examiner

*Primary Examiner* — William B Partridge
*Assistant Examiner* — Alexandre X Ramirez
(74) *Attorney, Agent, or Firm* — Birch, Stewart, Kolasch & Birch, LLP

(57) ABSTRACT

A thyristor memory cell includes a semiconductor cathode, a first un-doped semiconductor feature connected to the semiconductor cathode, a second un-doped semiconductor feature connected to the first un-doped semiconductor feature, a semiconductor anode connected to the second un-doped semiconductor feature, and a gate feature disposed on the first un-doped semiconductor feature or the second un-doped semiconductor feature. Among the semiconductor cathode, the first un-doped semiconductor feature, the second un-doped semiconductor feature and the semiconductor anode, the semiconductor anode has the highest bottom edge of conduction band, followed by the first un-doped semiconductor feature, the second un-doped semiconductor feature and the semiconductor cathode in the given order; and the semiconductor anode has the highest top edge of the valence band, followed by the first un-doped semiconductor feature, the second un-doped semiconductor feature and the semiconductor cathode in the given order.

20 Claims, 18 Drawing Sheets

(51) Int. Cl.
  *H10D 84/01*    (2026.01)
  *H10D 84/60*    (2025.01)

(a)

(b)

| | |
|---|---|
| Form dielectric stack | S01 |
| Form holes in dielectric stack | S02 |
| Form semiconductor stacks in holes | S03 |
| Form slits in dielectric stack | S04 |
| Deposit gate dielectric | S05 |
| Deposit gate metal | S06 |
| Remove sidewall metal | S07 |
| Deposit filling dielectric | S08 |
| Form bit lines | S09 |

315

310

305

300

THYRISTOR MEMORY CELL, THYRISTOR MEMORY ARRAY, AND METHOD FOR FABRICATING A THYRISTOR MEMORY ARRAY

BACKGROUND

Semiconductor memory devices are widely used in integrated circuits (ICs) to store digital data for electronic applications. Thyristor memory is one such semiconductor memory device that stores digital data based on electric properties thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
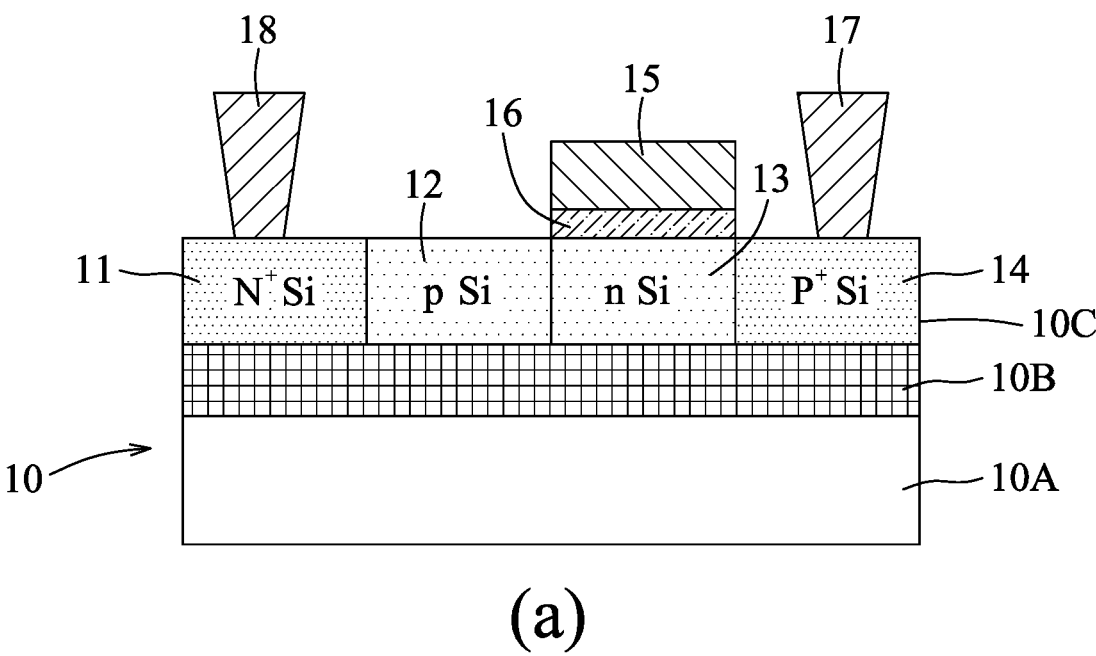
FIG. 1 includes a schematic diagram illustrating a thyristor memory cell and its band diagram in accordance with some embodiments.
Figure 1:
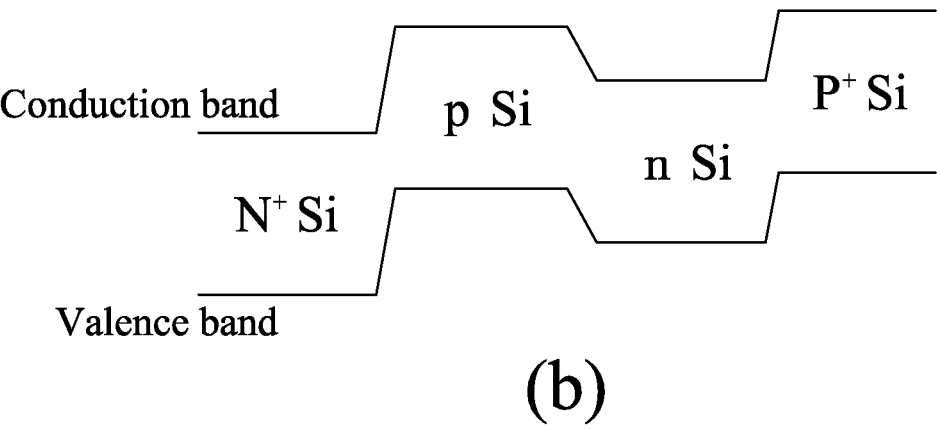

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a thyristor memory cell in accordance with a first embodiment. As depicted in part (a) of FIG. 1, the thyristor memory cell is formed on a silicon on insulator (SOI) wafer 10 that includes a bulk silicon substrate 10A, an insulator layer 10B (e.g., an $SiO_2$ layer, a sapphire layer, etc.) that is disposed over the bulk silicon substrate 10A and a silicon layer 10C that is disposed over the insulator layer 10B. The thyristor memory cell is formed in the silicon layer 10C, and includes a highly N-doped silicon feature 11, a P-doped silicon feature 12 that is connected to the highly N-doped silicon feature 11, an N-doped silicon feature 13 that is connected to the P-doped silicon feature 12, a highly P-doped silicon feature 14 that is connected to the N-doped silicon feature 13, and a gate feature that is disposed on the N-doped silicon feature 13. The term "N-doped" means that a base material (e.g., silicon in the illustrative embodiment) is doped with N-type dopants that can donate extra electrons to carry an electrical current, where the N-type dopants may be, for example, P, As, Sb, other suitable materials, or any combination thereof. The term "P-doped" means that a base material (e.g., silicon in the illustrative embodiment) is doped with P-type dopants that can create positively charged holes to carry an electrical current, where the P-type dopants may be, for example, B, Ga, Al, other suitable materials, or any combination thereof. A concentration of N-type dopants in the highly N-doped silicon feature 11 is greater than about $1019/cm^3$, and is higher than that in the N-doped silicon feature 13. A concentration of P-type dopants in the highly P-doped silicon feature 14 is greater than about $1019/cm^3$, and is higher than that in the P-doped silicon feature 12.

In the illustrative embodiment, the highly N-doped silicon feature 11, the P-doped silicon feature 12, the N-doped silicon feature 13 and the highly P-doped silicon feature 14 are connected in series in a horizontal direction that is parallel to a surface of the silicon layer 10C. The gate feature includes a gate electrode 15, and a gate dielectric 16 disposed between the N-doped silicon feature 13 and the gate electrode 15. The gate electrode 15 may include, for example, Ti, TiN, W, Ta, TaN, other suitable materials, or any combination thereof. The gate dielectric 16 may include, for example, $SiO_2$, $HfO_2$, HfZrO, $La_2O_3$, other high-k materials (i.e., dielectric materials whose dielectric constants are greater than that of silicon dioxide), other suitable materials, or any combination thereof. The highly N-doped silicon feature 11 serves as a cathode of the thyristor memory cell, and is electrically connected to a source line 18; and the highly P-doped silicon feature 14 serves as an anode of the thyristor memory cell, and is electrically connected to a bit line 17. The insulator layer 10B isolates the thyristor memory cell from the bulk silicon substrate 10A, and is thus able to prevent current leakage among the highly N-doped silicon feature 11, the P-doped silicon feature 12, the N-doped silicon feature 13 and the highly P-doped silicon feature 14 through the bulk silicon substrate 10A.

Part (b) of FIG. 1 illustrates a band diagram of the thyristor memory cell as shown in part (a) of FIG. 1. A bottom edge of a conduction band of the highly P-doped silicon feature 14 is higher than a bottom edge of a conduction band of the P-doped silicon feature 12, which is higher than a bottom edge of a conduction band of the N-doped silicon feature 13, which is higher than a bottom edge of a conduction band of the highly N-doped silicon feature 11 (namely, highly P-doped silicon feature 14>P-doped silicon feature 12>N-doped silicon feature 13>highly N-doped silicon feature 11 in terms of the bottom edges of their conduction bands). A top edge of a valence band of the highly P-doped silicon feature 14 is higher than a top edge of a valence band of the P-doped silicon feature 12, which is higher than a top edge of a valence band of the N-doped silicon feature 13, which is higher than a top edge of a valence band of the highly N-doped silicon feature 11 (namely, highly P-doped silicon feature 14>P-doped silicon feature 12>N-doped silicon feature 13>highly N-doped silicon feature 11 in terms of the top edges of their valence bands).

In the vicinity of a P-N junction (e.g., an interface between the highly N-doped silicon feature 11 and the P-doped silicon feature 12, an interface between the P-doped silicon feature 12 and the N-doped silicon feature 13, or an interface between the N-doped silicon feature 13 and the highly P-doped silicon feature 14), either the conduction band edge or the valence band edge extends slantingly upward from the N-doped region toward the P-doped region because of diffusion of charge carriers across the P-N junction (e.g., diffusion of negative charges from the N-doped region to the P-doped region, and diffusion of positive charges from the P-doped region to the N-doped region).

Figure 2:
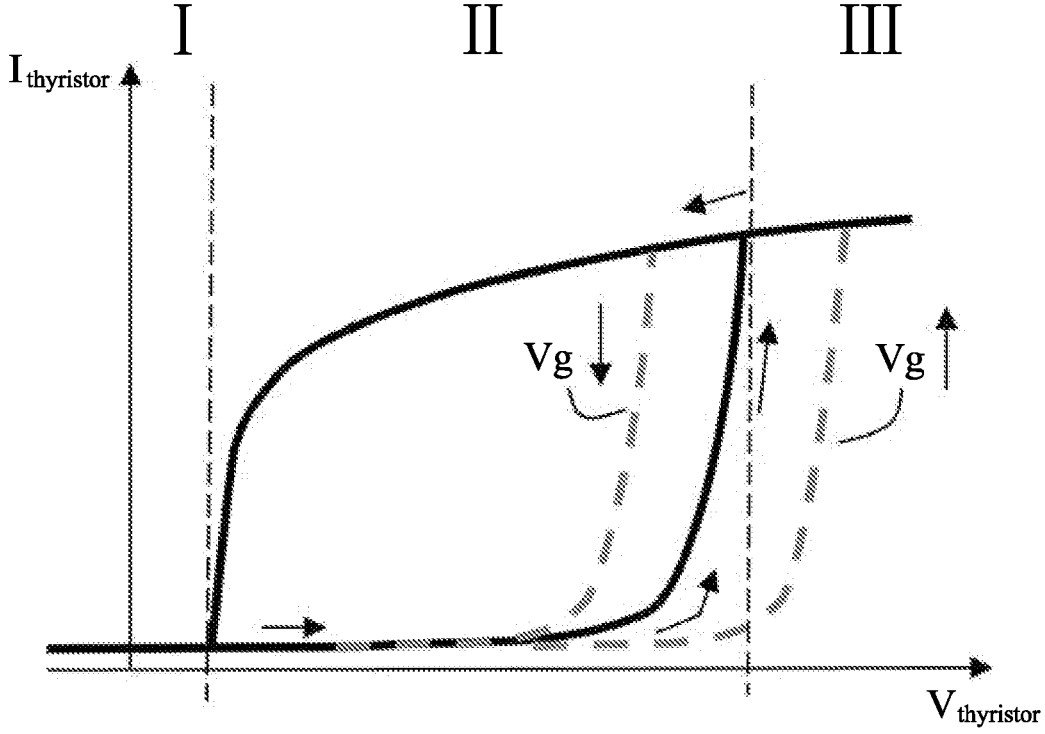
FIG. 2 is a plot illustrating a current-voltage characteristic of a thyristor memory cell in accordance with some embodiments.

FIG. 2 illustrates a general voltage-current characteristic of a thyristor memory cell, where $V_{thyristor}$ represents a voltage between an anode and a cathode of the thyristor memory cell, $V_g$ represents a voltage between a gate and the cathode of the thyristor memory cell, and $I_{thyristor}$ represents a current flowing through the thyristor memory cell. The bi-stable characteristic makes the thyristor memory cell suited to storing logic data "0" or "1." In accordance with some embodiments, logic data "0" can be written into the thyristor memory cell by operating the thyristor memory cell in region I, logic data "1" can be written into the thyristor memory cell by operating the thyristor memory cell in region III, and stored data can be read out from the thyristor memory cell by operating the thyristor memory cell in region II. The magnitude of $V_g$ can be used to adjust a voltage threshold for entering region III (e.g., for writing logic data "1"). The thyristor memory cell is advantageous in having a large memory window (owing to a high on/off current ratio, generally greater than $10^6$), a high read/write speed (generally requiring less than 10 ns for a read/write operation), high endurance (resulting from a mature gate oxide process and low operation voltages), and long retention time (ranging from milliseconds to seconds, which is comparable to dynamic random access memory, DRAM) and is suited to near-memory applications, where memory devices are disposed close to computational logic (e.g., a processor), and usually require a lower latency and a greater bandwidth.

Figure 3:
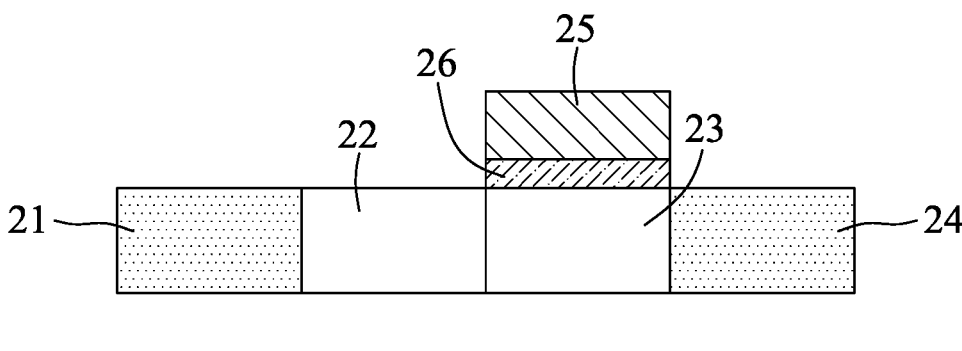
FIG. 3 is a schematic diagram illustrating a thyristor memory cell in accordance with some embodiments.

FIG. 3 illustrates a thyristor memory cell in accordance with a second embodiment. The thyristor memory cell includes a semiconductor cathode 21, a first un-doped (or intrinsic) semiconductor feature 22 that is connected to the semiconductor cathode 21, a second un-doped (or intrinsic) semiconductor feature 23 that is connected to the first un-doped semiconductor feature 22, a semiconductor anode 24 that is connected to the second un-doped semiconductor feature 23, and a gate feature that is disposed on the second un-doped semiconductor feature 23. The gate feature includes a gate electrode 25, and a gate dielectric 26 disposed between the second un-doped semiconductor feature 23 and the gate electrode 25. In accordance with some embodiments, the gate feature may be disposed on the first un-doped semiconductor feature 22, in which case the gate dielectric 26 is disposed between the first un-doped semiconductor feature 22 and the gate electrode 25; however, this disclosure is not limited in this respect. In accordance with some embodiments, the semiconductor cathode 21 and the semiconductor anode 24 are made of doped semiconductor materials in order to have good electrical conductivity and/or good ohmic contact with metal lines (e.g., a source line or a bit line, which is made of metal).

The first un-doped semiconductor feature 22 and the second un-doped semiconductor feature 23 are made of different semiconductor materials, so as to have different energy band structures. Each of the first un-doped semiconductor feature 22 and the second un-doped semiconductor feature 23 can be made of a group IV semiconductor or a group III-V semiconductor. In accordance with some embodiments, the first un-doped semiconductor feature 22 and the second un-doped semiconductor feature 23 are formed using different group IV semiconductors. In accordance with some embodiments, the first un-doped semiconductor feature 22 and the second un-doped semiconductor feature 23 are formed using different group III-V semiconductors. However, this disclosure is not limited in this respect.

In the second embodiment, a bottom edge of a conduction band of the semiconductor anode 24 is higher than a bottom edge of a conduction band of the first un-doped semiconductor feature 22, which is higher than a bottom edge of a conduction band of the second un-doped semiconductor feature 23, which is higher than a bottom edge of a conduction band of the semiconductor cathode 21 (namely, semiconductor anode 24>first un-doped semiconductor feature 22>second un-doped semiconductor feature 23>semiconductor cathode 21 in terms of the bottom edges of their conduction bands); and a top edge of a valence band of the semiconductor anode 24 is higher than a top edge of a valence band of the first un-doped semiconductor feature 22, which is higher than a top edge of a valence band of the second un-doped semiconductor feature 23, which is higher than a top edge of a valence band of the semiconductor cathode 21 (namely, semiconductor anode 24>first un-doped semiconductor feature 22>second un-doped semiconductor feature 23>semiconductor cathode 21 in terms of the top edges of their valence bands).

Figure 4:
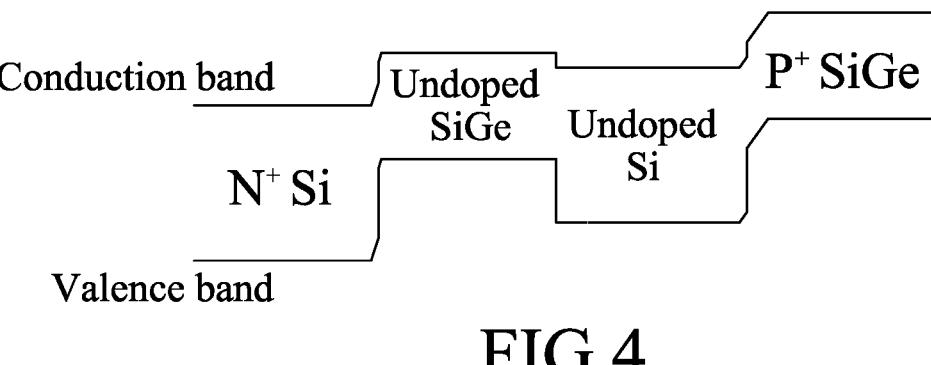
FIGS. 4, 5 and 6 are band diagrams of thyristor memory cells having different material compositions.

FIG. 4 illustrates a band diagram of a first example of the thyristor memory cell in accordance with the second embodiment as shown in FIG. 3. In this example, the semiconductor cathode 21 is made of highly N-doped silicon ($N^+$ Si), the first un-doped semiconductor feature 22 is made of un-doped (or intrinsic) SiGe, the second un-doped semiconductor feature 23 is made of un-doped (or intrinsic) silicon, and the semiconductor anode 24 is made of highly P-doped SiGe ($P^+$ SiGe). It can be seen that the inherent difference in energy bands between different materials would result in a vertical jump in the band diagram at each junction that is formed by two different materials (e.g., the junction between P⁺ SiGe and un-doped silicon, the junction between un-doped silicon and un-doped SiGe, and the junction between un-doped SiGe and N⁺ Si), thereby forming a sharp energy barrier, which may lead to longer retention time when the thyristor memory cell holds data therein. On the other hand, the diffusion of dopants would result in gradual changes in the band diagram. For example, the dopants in the semiconductor cathode 21 (e.g., N⁺ Si) may diffuse into the first un-doped semiconductor feature 22, thereby forming two slanting line portions that are respectively connected to opposite ends of the vertical jump at the junction between the semiconductor cathode 21 and the first un-doped semiconductor feature 22 in the band diagram; and the dopants in the semiconductor anode 24 (e.g., P⁺ SiGe) may diffuse into the second un-doped semiconductor feature 23, thereby forming two slanting line portions that are respectively connected to opposite ends of a vertical jump at the junction between the semiconductor anode 24 and the second un-doped semiconductor feature 23 in the band diagram.

Figure 5:
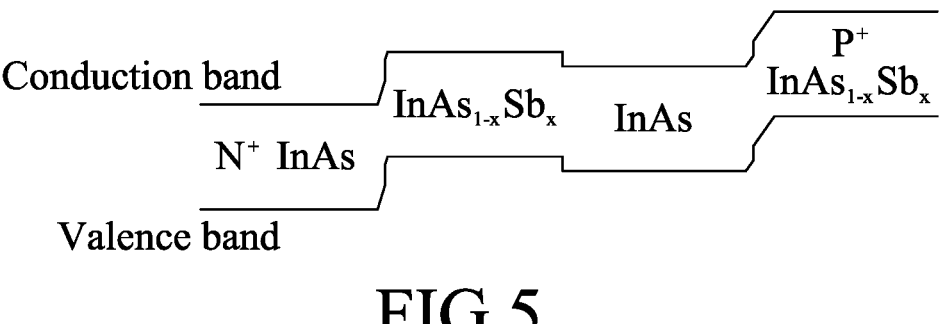

FIG. 5 illustrates a band diagram of a second example of the thyristor memory cell in accordance with the second embodiment as shown in FIG. 3. In this example, the semiconductor cathode 21 is made of highly N-doped InAs (N⁺ InAs), the first un-doped semiconductor feature 22 is made of un-doped (or intrinsic) $InAs_{1-x}Sb_x$, the second un-doped semiconductor feature 23 is made of un-doped (or intrinsic) InAs, and the semiconductor anode 24 is made of highly P-doped $InAs_{1-x}Sb_x$ (P⁺ $InAs_{1-x}Sb_x$).

Figure 6:
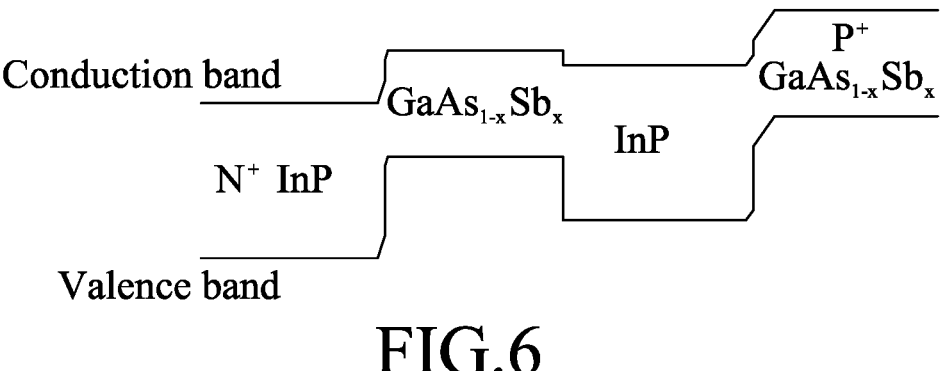

FIG. 6 illustrates a band diagram of a third example of the thyristor memory cell in accordance with the second embodiment as shown in FIG. 3. In this example, the semiconductor cathode 21 is made of highly N-doped InP (N⁺ InP), the first un-doped semiconductor feature 22 is made of un-doped (or intrinsic) $GaAs_{1-x}Sb_x$, the second un-doped semiconductor feature 23 is made of un-doped (or intrinsic) InP, and the semiconductor anode 24 is made of highly P-doped $GaAs_{1-x}Sb_x$ (P⁺ $GaAs_{1-x}Sb_x$).

However, the materials used in the thyristor memory cell are not limited to those provided above, and other suitable materials may be applicable as long as the band diagram can be formed into the desired pattern. For example, $InAl_{1-x}As_x$ may be used to replace $GaAs_{1-x}Sb_x$ in the third example of the thyristor memory cell.

In accordance with the first, second and third examples as illustrated in FIGS. 4, 5 and 6, the semiconductor cathode 21 and the second un-doped semiconductor feature 23 employ the same base material (e.g., Si in FIG. 4, InAs in FIG. 5, and InP in FIG. 6), and the semiconductor anode 24 and the first un-doped semiconductor feature 22 employ the same base material (e.g., SiGe in FIG. 4, $InAs_{1-x}Sb_x$ in FIG. 5, and $GaAs_{1-x}Sb_x$ in FIG. 6). Such configuration uses the minimal number of base materials to form the thyristor memory cell in accordance with the second embodiment, and complexity of the manufacturing process may thus be minimized, but this disclosure is not limited to such configuration, as long as the energy levels of the conduction bands and the valence bands of the materials used in the thyristor memory cell conform to the aforesaid requirements. For example, in the first example as shown in FIG. 4, highly P-doped SiGe (P⁺ SiGe) may be replaced using highly P-doped silicon to form the semiconductor anode 24, as long as the bottom edge of the conduction band of the semiconductor anode 24 is higher than the bottom edge of the conduction band of the first un-doped semiconductor feature 22 and the top edge of the valence band of the semiconductor anode 24 is higher than the top edge of the valence band of the first un-doped semiconductor feature 22.

In comparison to the first embodiment, the thyristor memory cell of the second embodiment may have better thermal resistance. The use of the first un-doped semiconductor feature 22 and the second un-doped semiconductor feature 23 may alleviate thermal fluctuations that often occur in the dopants in thermal processes because commonly used dopants are usually lightweight, and the thermal fluctuations of the dopants may have undesirable influence on doping profiles and band profiles.

Figure 7:
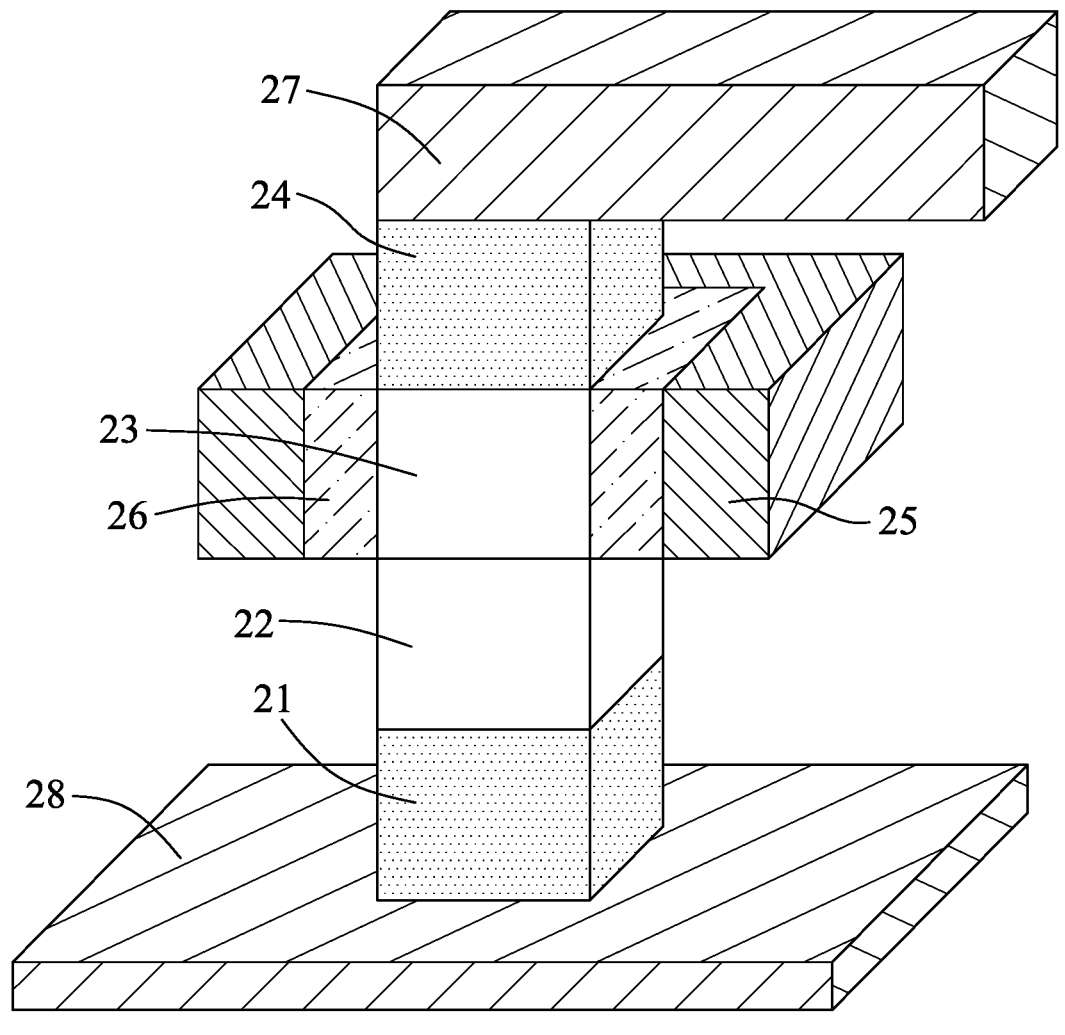
FIG. 7 is a fragmentary perspective view illustrating a three-dimensional thyristor memory cell in accordance with some embodiments.

Referring to FIG. 7, the thyristor memory cell of the second embodiment is applicable to a three-dimensional (3D) structure in accordance with some embodiments. The 3D structure occupies less chip area than a two-dimensional structure (for example, a structure shown in part (a) of FIG. 1), so a higher memory density can be achieved in comparison to a two-dimensional structure.

In FIG. 7, a source line 28 is formed in or over a semiconductor substrate (not shown), and the semiconductor cathode 21 is disposed over the source line 28. The first un-doped semiconductor feature 22 is stacked over and connected to the semiconductor cathode 21 in a vertical direction that is perpendicular to a surface of the semiconductor substrate (which can be deemed as the top surface of the source line 28 in FIG. 7), the second un-doped semiconductor feature 23 is stacked over and connected to the first un-doped semiconductor feature 22 in the vertical direction, and the semiconductor anode 24 is stacked over and connected to the second un-doped semiconductor feature 23 in the vertical direction. In other words, the semiconductor cathode 21, the first un-doped semiconductor feature 22, the second un-doped semiconductor 23 and the semiconductor anode 24 are stacked together and connected in series over the semiconductor substrate in the vertical direction. The gate feature, which includes the gate electrode 25 and the gate dielectric 26, surrounds the second un-doped semiconductor feature 23 (noting that a portion of the gate feature that is disposed at the front side of the second un-doped semiconductor feature 23 is not illustrated in FIG. 7 for the purpose of showing the second un-doped semiconductor feature 23). A bit line 27 is formed over and electrically connected to the semiconductor anode 24, and extends in a first horizontal direction that is parallel to the surface of the semiconductor substrate and perpendicular to the vertical direction.

In such a 3D structure, since the first un-doped semiconductor feature 22, the second un-doped semiconductor 23 and the semiconductor anode 24 are stacked vertically over the semiconductor substrate, there would be no current leakage among the semiconductor cathode 21, the first un-doped semiconductor feature 22, the second un-doped semiconductor 23 and the semiconductor anode 24 through the semiconductor substrate, and thus the insulator layer 10B in the first embodiment (see part (a) of FIG. 1) can be omitted, which means that an ordinary semiconductor wafer can be used in the second embodiment instead of the SOI wafer as used in the first embodiment, thereby reducing the material cost.

Figure 8:
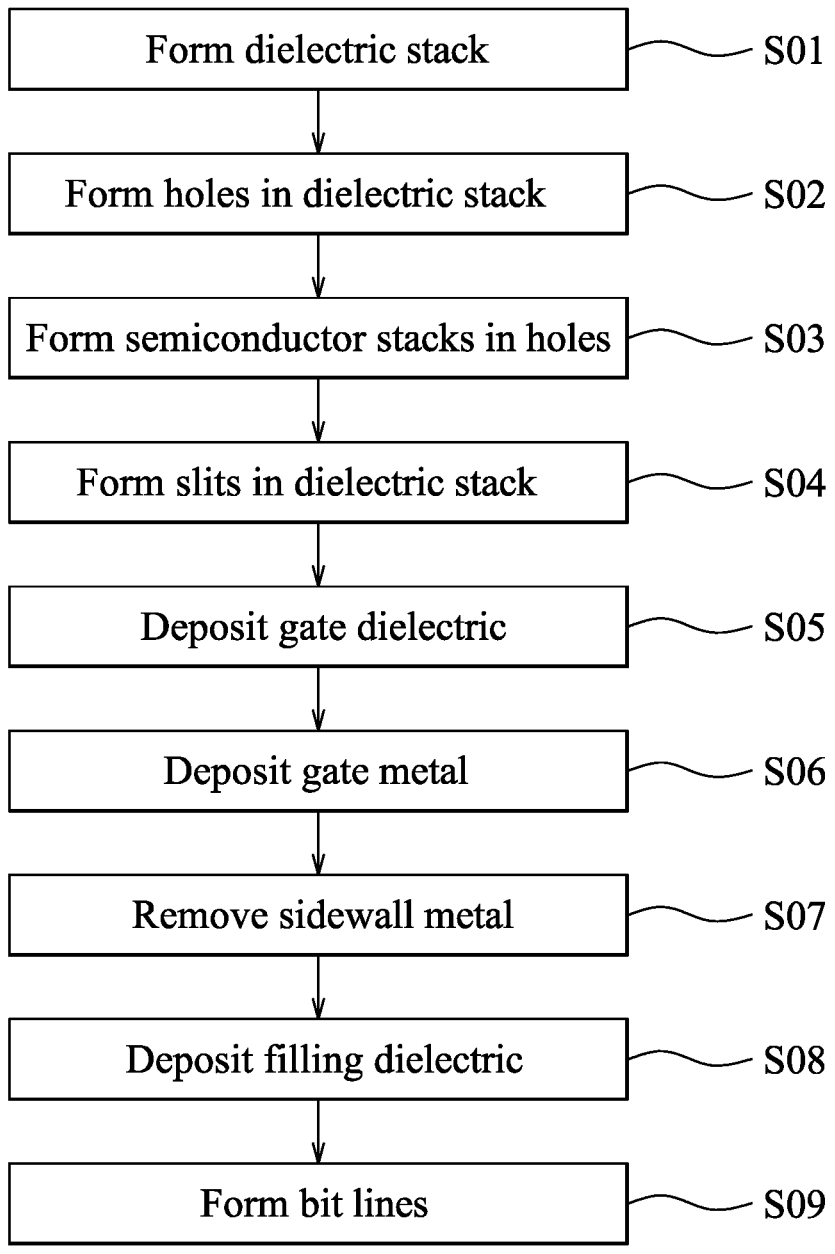
FIG. 8 is a flow chart illustrating steps of a method for fabricating a thyristor memory array in accordance with some embodiments.

FIG. 8 is a flow chart illustrating an example of a method for fabricating a thyristor memory array in accordance with some embodiments, where the thyristor memory array is composed of a plurality of 3D thyristor memory cells of the second embodiment. In this embodiment, the semiconductor cathode 21, the first un-doped semiconductor feature 22, the second un-doped semiconductor feature 23 and the semiconductor anode 24 of the 3D thyristor memory cells are exemplified to be made of highly N-doped Si, un-doped SiGe, un-doped silicon, and highly P-doped Si, respectively, but this disclosure is not limited in this respect.

Figure 9:
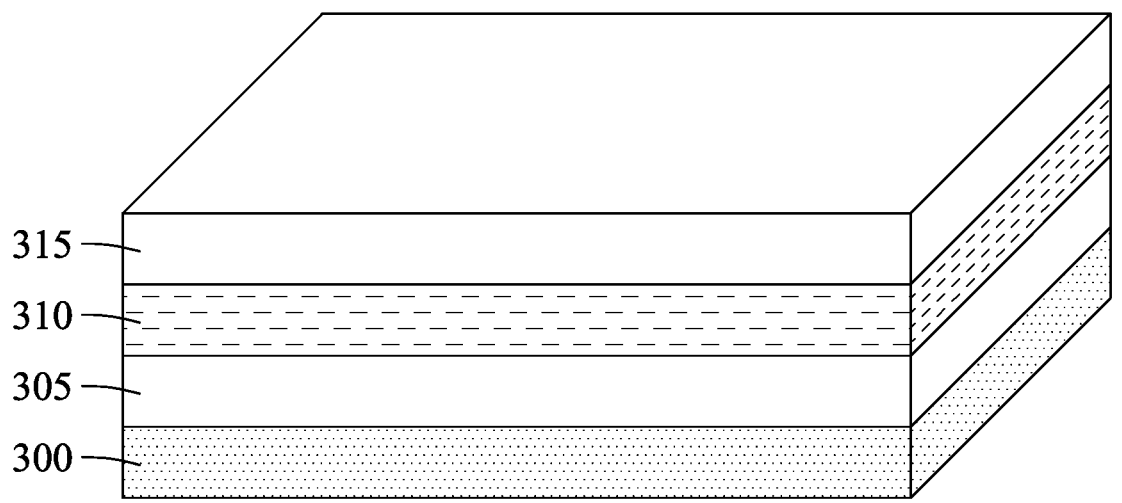
FIGS. 9 to 17 are perspective views that cooperate with FIG. 8 to illustrate the steps of the method for fabricating a thyristor memory array in accordance with some embodiments.

Referring to FIGS. 8 and 9, a dielectric stack feature is formed (step S01) to include a first semiconductor layer 300, a first dielectric layer 305 stacked over the first semiconductor layer 300, a sacrificial layer 310 stacked over the first dielectric layer 305, and a second dielectric layer 315 stacked over the sacrificial layer 310. In the illustrative embodiment, the first semiconductor layer 300 is realized as a doped semiconductor substrate (e.g., a bulk silicon substrate that is highly N-doped), and will be used as the semiconductor cathodes of the thyristor memory cells as well as a common source line, so additional process steps are not required to form the first semiconductor layer 300. In other words, the layers 300, 305, 310 and 315 are stacked in the given order from bottom to top in the vertical direction that is perpendicular to a surface of the semiconductor substrate. In accordance with some embodiments, the semiconductor substrate may be a highly P-doped bulk silicon substrate, and be used as the semiconductor anodes of the thyristor memory cells, and this disclosure is not limited in this respect.

It is noted that the sacrificial layer 310 is used to define a height/vertical position of the gate features of the thyristor memory cells to be formed. In the illustrative embodiment, the gate features are to be formed on higher-positioned un-doped semiconductor features (e.g., the second un-doped semiconductor feature 23 in FIG. 7) of the thyristor memory cells, so the sacrificial layer 310 is formed to be stacked over the first dielectric layer 305 (namely, between the first dielectric layer 305 and the second dielectric layer 315), which corresponds in position to lower-positioned un-doped semiconductor features (e.g., the first un-doped semiconductor feature 22 in FIG. 7) of the thyristor memory cells to be formed. In some embodiments where the gate features are to be formed on the lower-positioned un-doped semiconductor features of the thyristor memory cells, the sacrificial layer 310 may be formed under the first dielectric layer 305 (namely, between the first semiconductor layer 300 and the first dielectric layer 305), and the first dielectric layer 305 and the second dielectric layer 315 can be integrated together as a thicker dielectric layer, thereby reducing a total number of process steps.

In accordance with some embodiments, the first dielectric layer 305 and the second dielectric layer 315 may include, for example, $Si_xO_y$, $Si_xN_y$, $SiO_xN_y$, other suitable materials, or any combination thereof. The sacrificial layer 310 may include, for example, $Si_xO_y$, $Si_xN_y$, $SiO_xN_y$, other suitable materials, or any combination thereof. However, the material used in the sacrificial layer 310 is different from the material(s) used in the first dielectric layer 305 and the second dielectric layer 315 in order to achieve desired etching selectivity. In the illustrative embodiment, the first dielectric layer 305 and the second dielectric layer 315 are made of $SiO_2$, and the sacrificial layer 310 is made of SiN, but this disclosure is not limited in this respect. The first dielectric layer 305, the sacrificial layer 310 and the second dielectric layer 315 can be deposited using, for example but not limited to, chemical vapor deposition (CVD), plasma-enhanced chemical vapor deposition (PECVD), physical vapor deposition (PVD), atomic layer deposition (ALD), other suitable techniques, or any combination thereof.

Figure 10:
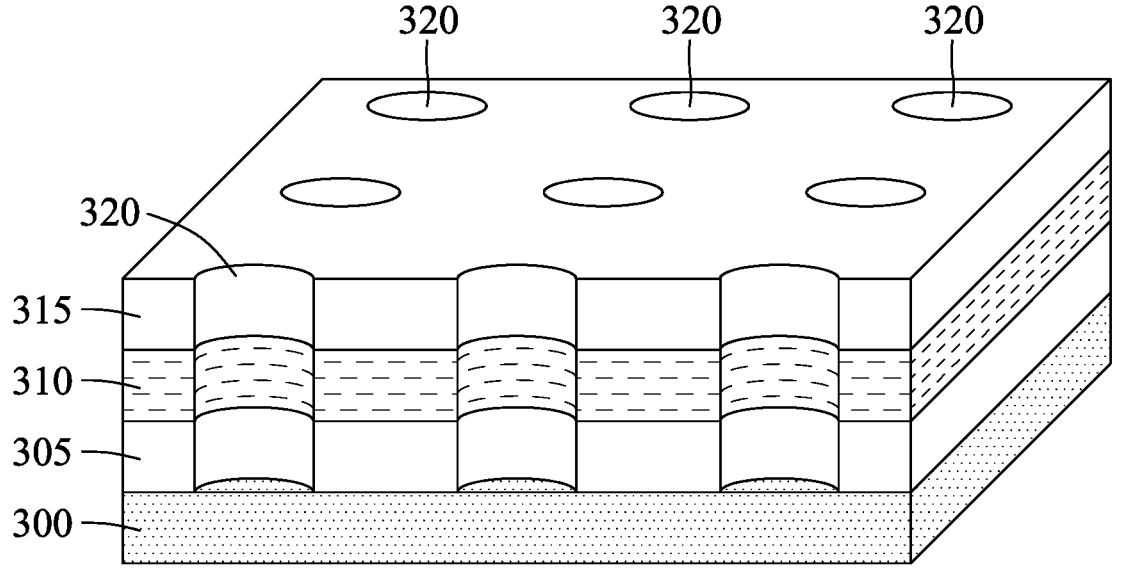

Referring to FIGS. 8 and 10, the dielectric stack feature is etched to form a plurality of holes 320 therein (step S02) using, for example, anisotropic etching (e.g., reactive ion etching, RIE), other suitable techniques, or any combination thereof. The holes 320 are arranged in an array that includes multiple columns and multiple rows, and penetrate through the second dielectric layer 315, the sacrificial layer 310 and the first dielectric layer 305, thereby exposing the first semiconductor layer 300. The columns of the holes 320 are arranged in the first horizontal direction with the holes 320 in each column being arranged in a second horizontal direction that is perpendicular to the first horizontal direction and the vertical direction (i.e., parallel to the surface of the semiconductor substrate), and the rows of the holes 320 are arranged in the second horizontal direction with the holes 320 in each row being arranged in the first horizontal direction.

Figure 11:
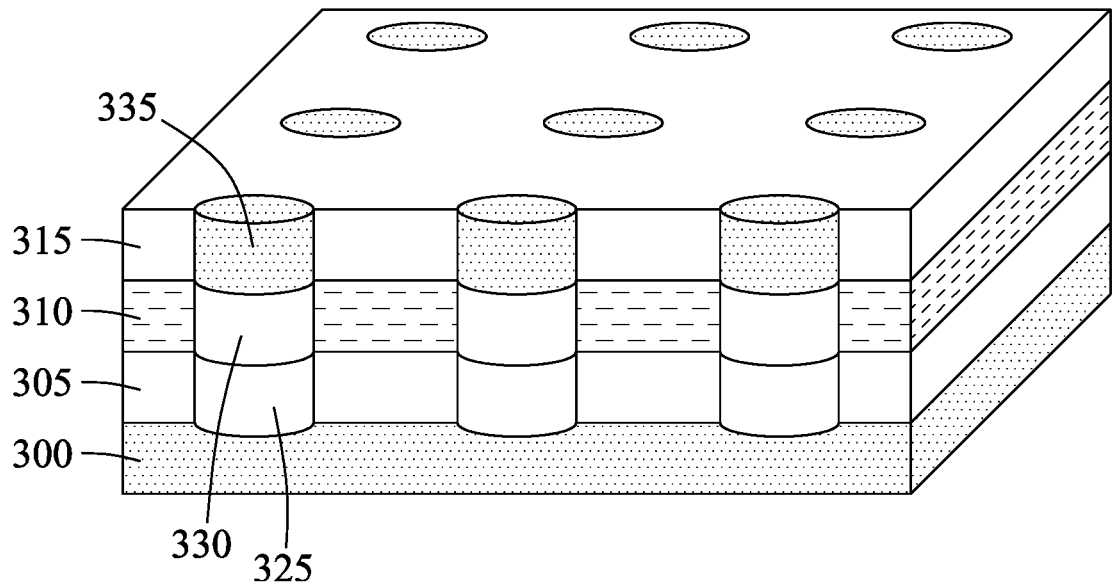

Referring to FIGS. 8 and 11, a plurality of semiconductor stacks are formed (step S03) respectively in the holes 320 (see FIG. 10), and the array of the hole 320 is thus transformed into an array of the semiconductor stacks. As a result, the semiconductor stacks are formed as pillars standing on the first semiconductor layer 300. Each of the semiconductor stacks includes a first un-doped semiconductor layer 325 stacked on the first semiconductor layer 300, a second un-doped semiconductor layer 330 stacked on the first un-doped semiconductor layer 325, and a second semiconductor layer 335 stacked on the second un-doped semiconductor layer 330. The first un-doped semiconductor layer 325, the second un-doped semiconductor layer 330 and the second semiconductor layer 335 are to be used respectively as the aforesaid first un-doped semiconductor feature, the aforesaid second un-doped semiconductor feature and the aforesaid semiconductor anode of the thyristor memory cell in the second embodiment. In the illustrative embodiment, the first un-doped semiconductor layer 325 is an un-doped SiGe layer, the second un-doped semiconductor layer 330 is an un-doped silicon layer, and the second semiconductor layer 335 is a highly P-doped silicon layer. The first un-doped semiconductor layer 325, the second un-doped semiconductor layer 330 and the second semiconductor layer 335 respectively correspond to the first dielectric layer 305, the sacrificial layer 310 and the second dielectric layer 315 in position and in thickness, and are formed using, for example, selective epitaxy, other suitable techniques, or any combination thereof. In-situ doping may be performed during the epitaxial growth of the second semiconductor layer 335, thereby making the second semiconductor layer 335 doped. After the depositions of the semiconductor layers 325, 330, 335, a chemical-mechanical planarization (CMP) process may be performed to remove superfluous parts of the semiconductor layers 325, 330, 335 that are deposited over the second dielectric layer 315. It is noted that, in FIGS. 10 to 17, the holes 320 of the front row are drawn in fragmentary form, while the semiconductor stacks formed in the holes 320 of the front row and features that are subsequently formed thereon are drawn in complete form, in order to clearly show formation and structures of the thyristor memory cells.

Figure 12:
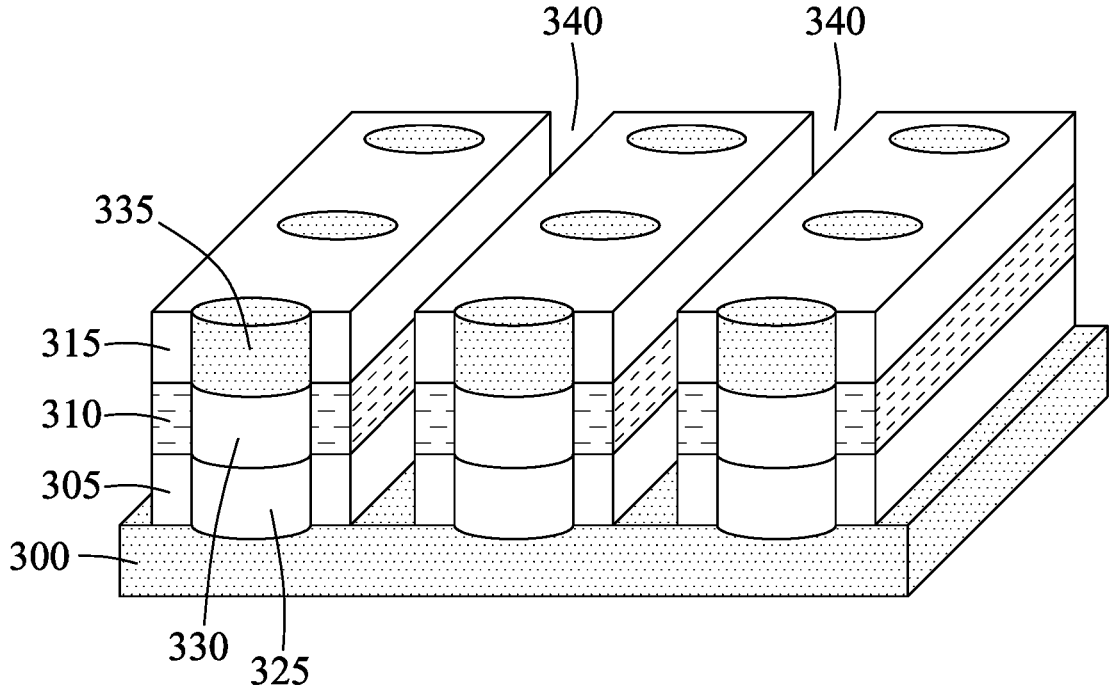

Referring to FIGS. 8 and 12, the dielectric stack feature is etched to form a plurality of slits 340 therein (step S04). The slits 340 are arranged in the first horizontal direction, extend in the second horizontal direction, and are disposed to split the sacrificial layer 310 into multiple segments, each corresponding to a respective column of the semiconductor stacks and being exposed at lateral sides thereof. In the illustrative embodiment, each slit 340 penetrates through at least the second dielectric layer 315 and the sacrificial layer 310, and is disposed between adjacent two of the columns of the array of the semiconductor stacks. In the illustrative embodiment, the slits 340 also penetrate the first dielectric layer 305. The etching may be performed using, for example, anisotropic etching (e.g., RIE), other suitable techniques, or any combination thereof.

Figure 13:
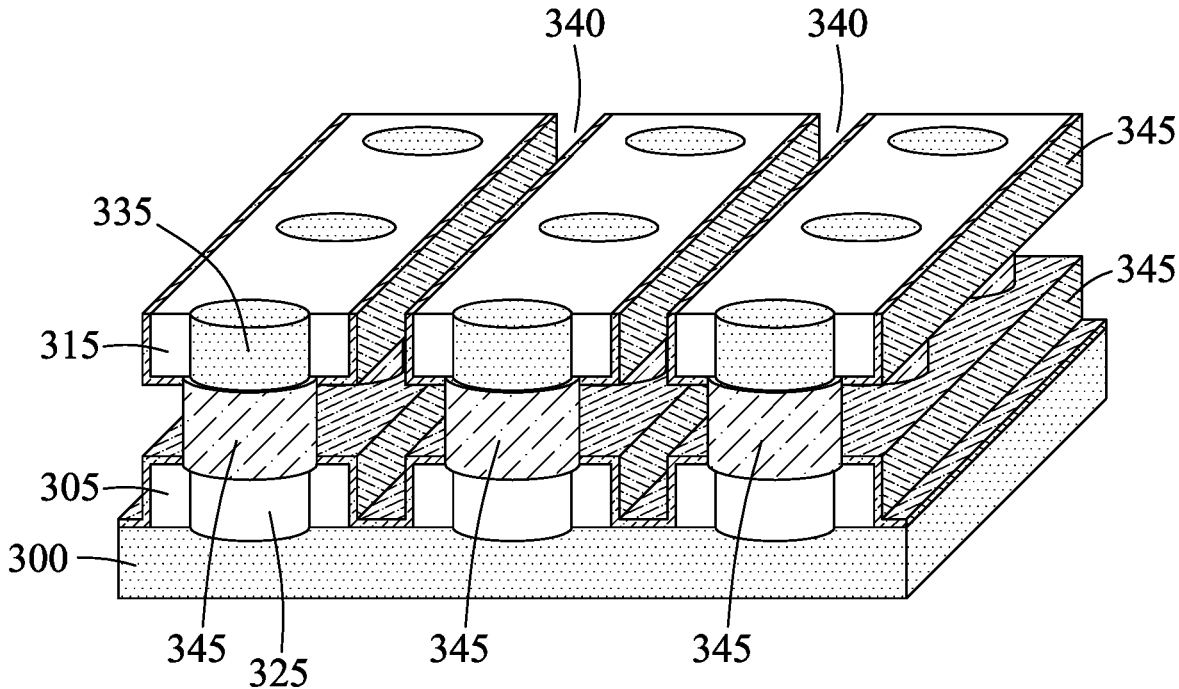

Referring to FIGS. 8 and 13, the sacrificial layer 310 (see FIG. 12) is removed through the slits 340 to partly expose the semiconductor stacks (e.g., exposing the second un-doped semiconductor layers 330 (see FIG. 12) of the semiconductor stacks in the illustrative embodiment), and a gate dielectric layer 345 is then conformally deposited (step S05), through the slits 340, on the exposed parts of the semiconductor stacks, in the slits 340, and in etched spaces that are created by removal of the sacrificial layer 310 (e.g., the space between the top surface of the first dielectric layer 305 and the bottom surface of the second dielectric layer 315 in the illustrative embodiment). Since the sacrificial layer 310 is removed, parts of the semiconductor stacks that correspond in position to the sacrificial layer 310 (e.g., the second un-doped semiconductor layer 330 in the illustrative embodiment) are exposed from the etched spaces in every horizontal direction after the etching, and thus the resultant gate dielectric layer 345 is formed to surround the exposed part of each of the semiconductor stacks. The sacrificial layer 310 may be removed using, for example, isotropic etching, other suitable techniques, or any combination thereof. The gate dielectric layer 345 may include, for example, $SiO_2$, $HfO_2$, HfZrO, $La_2O_3$, other high-k materials, other suitable materials, or any combination thereof, and may be formed using, for example, ALD, CVD, other suitable techniques, or any combination thereof.

Figure 14:
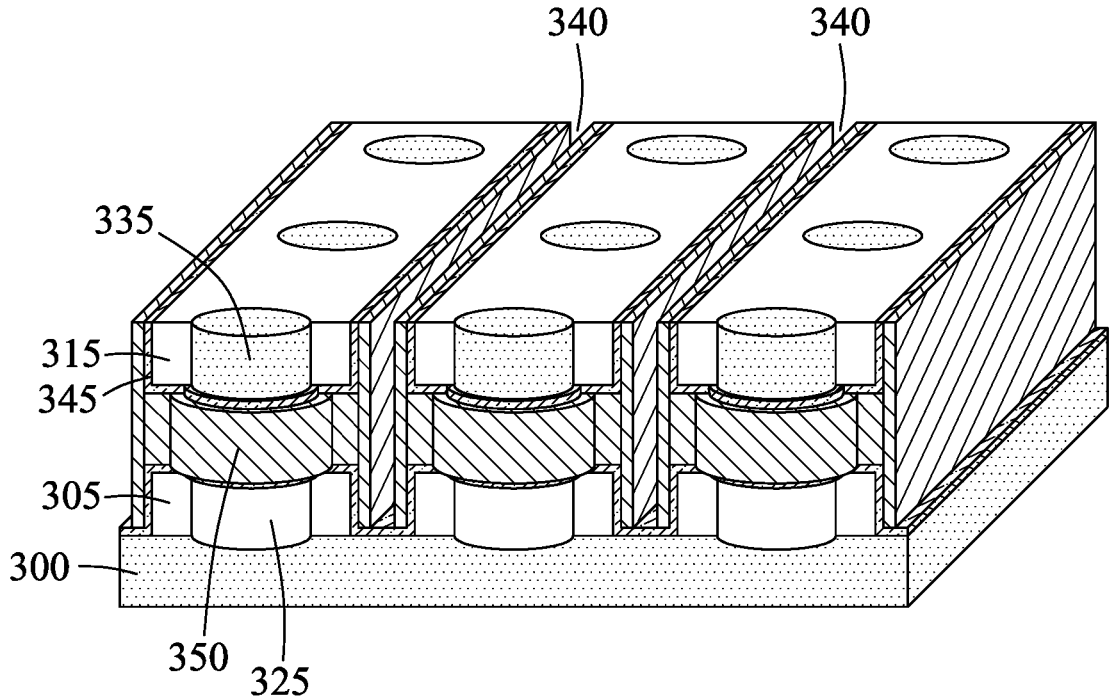

Referring to FIGS. 8 and 14, a gate metal layer 350 is deposited on the gate dielectric layer 345 (step S06) through the slits 340 to surround the semiconductor stacks, so as to form a gate electrode for each of the semiconductor stacks. In accordance with some embodiments, the gate metal layer 350 may be deposited using, for example, CVD. ALD, other suitable techniques, or any combination thereof, and include, for example, Ti, TiN. W. Ta, TaN, other suitable materials, or any combination thereof. Since the slits 340 physically split the semiconductor stacks into columns, the gate electrodes of the semiconductor stacks in the same column are electrically connected to each other. In the illustrative embodiment, the gate metal layer 350 is formed to fill up the etched spaces, but this disclosure is not limited in this respect.

Figure 15:
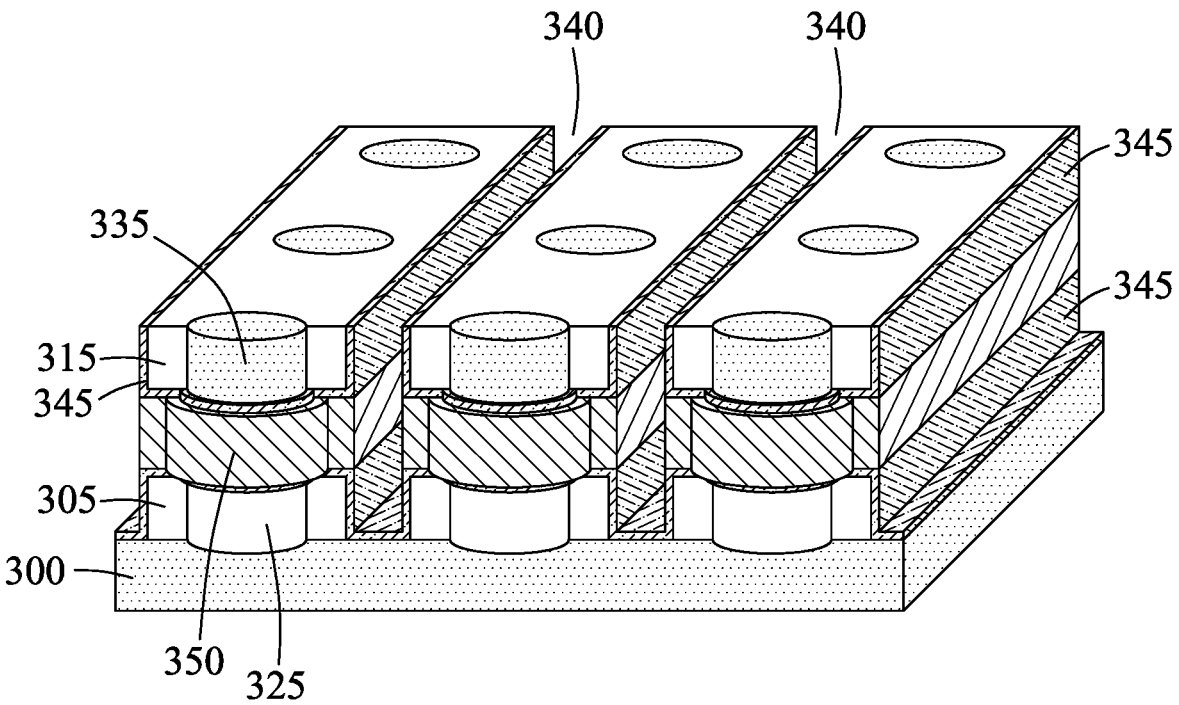

Referring to FIGS. 8 and 15, parts of the gate metal layer 350 that are disposed on sidewalls and at the bottoms of the slits 340 are removed (step S07) using, for example, isotropic etching (e.g., wet etching), other suitable techniques, or any combination thereof. As a result, among the columns of semiconductor stacks, the gate electrodes of the semiconductor stacks in each column are electrically isolated from the gate electrodes of the semiconductor stacks in all other columns. The remaining parts of the gate metal layer 350 are disposed in the etched spaces created by the removal of the sacrificial layer 310, and serve as the gate electrodes that surround the semiconductor stacks.

Through steps S05 to S07, a gate feature that includes a gate electrode (formed by the remaining gate metal layer 350) and a gate dielectric (formed by the gate dielectric layer 345) is formed on the desired portion (e.g., the second un-doped semiconductor layer 330) of each of the semiconductor stacks through the slits 340.

Figure 16:
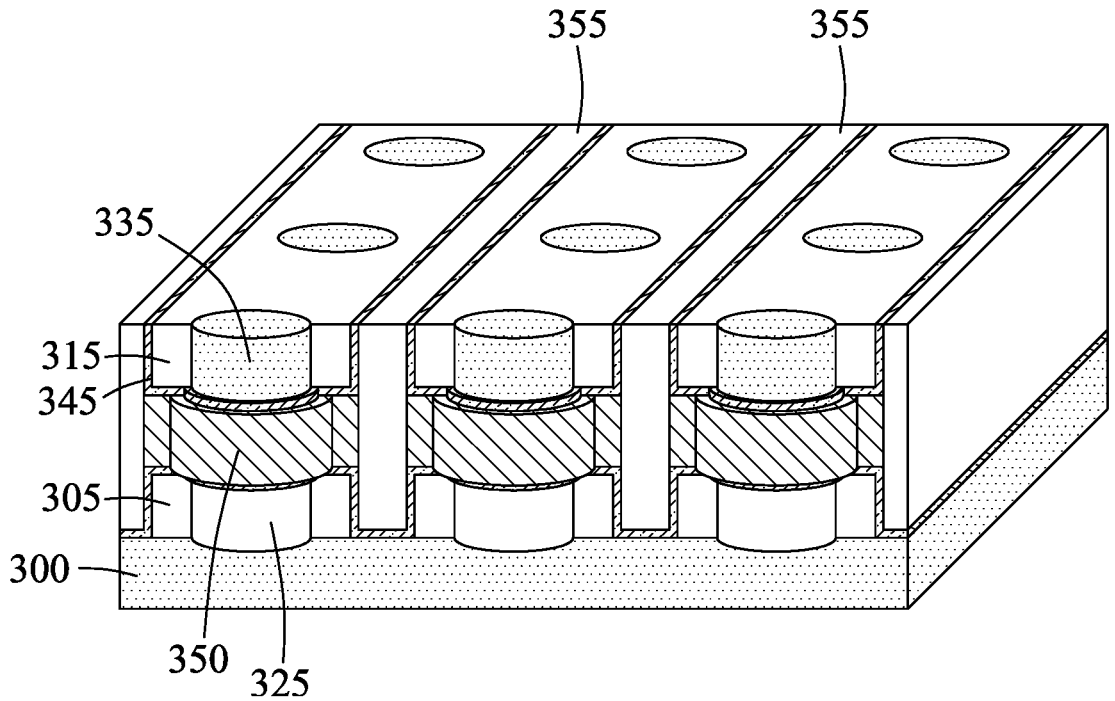

Referring to FIGS. 8 and 16, a dielectric layer 355 is deposited to fill up the slits 340 (step S08) using, for example, CVD, PVD, ALD, other suitable techniques, or any combination thereof. The dielectric layer 335 may include, for example, $Si_xO_y$, $Si_xN_y$, $SiO_xN_y$, other suitable materials, or any combination thereof. In accordance with some embodiments, the dielectric layer 355 may use the same material as with either the first dielectric layer 305 or the second dielectric layer 315. In accordance with some embodiments, the dielectric layer 355 may use a material that is different from the materials used in the first dielectric layer 305 and the second dielectric layer 315. After the deposition of the dielectric layer 355, a CMP process may be performed to reveal the second semiconductor layers 335 of the semiconductor stacks.

Figure 17:
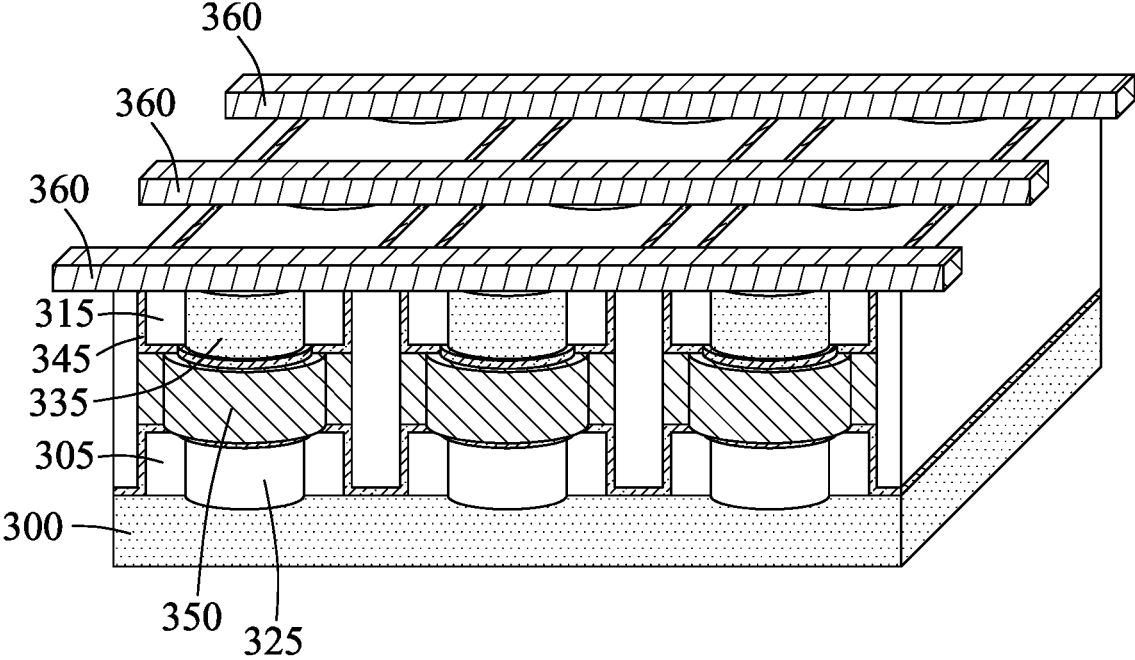

Referring to FIGS. 8 and 17, a plurality of bit lines 360 are formed over the second dielectric layer 315 and the second semiconductor layers 335 of the semiconductor stacks in the vertical direction. The bit lines 360 may be formed using, for example, a damascene process, other suitable processes, or any combination thereof, and may be made of, for example, Cu, Ti, TiN, Ta. TaN. W. Ru, Al, other suitable materials, or any combination thereof. The bit lines 360 extend in the first horizontal direction, are arranged in the second horizontal direction, and respectively correspond in position to the rows of the array. Each of the bit lines 360 is electrically connected to the second semiconductor layers 335 of some of the semiconductor stacks that are formed in those of the holes 320 (see FIGS. 10 and 11) that are in the corresponding one of the rows.

Figure 18:
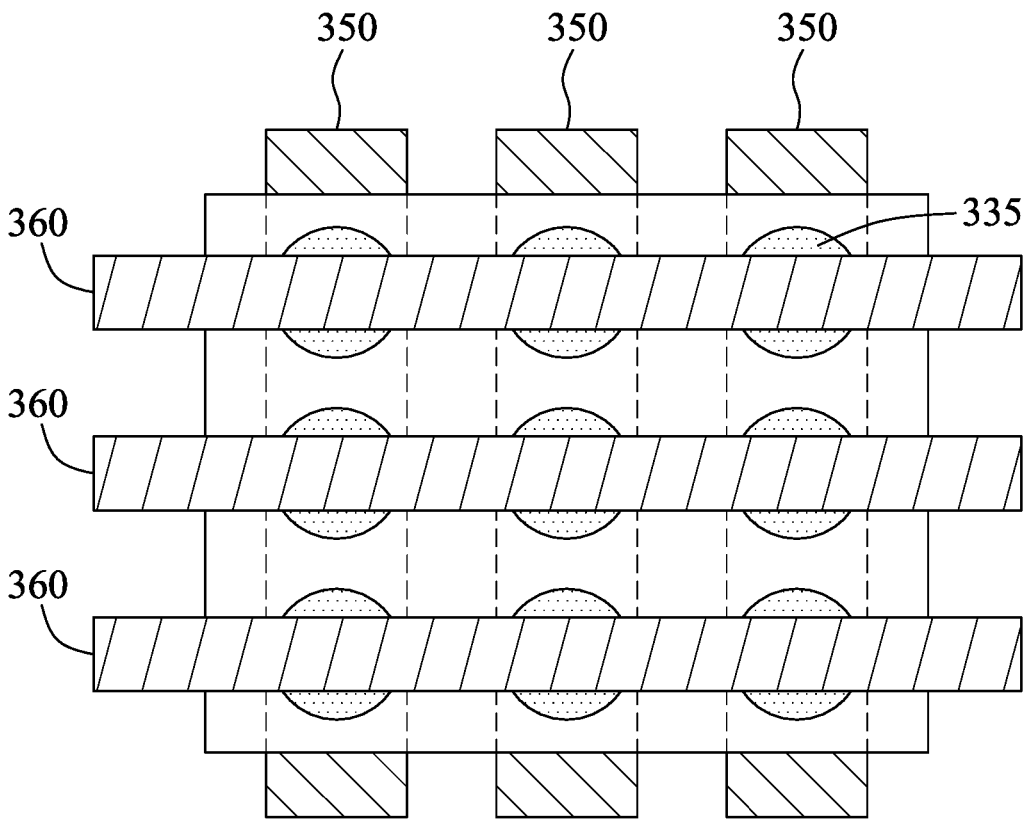
FIG. 18 is a schematic diagram illustrating a top view of a thyristor memory array in accordance with some embodiments.

FIG. 18 illustrates a top view of a thyristor memory array that is formed using the method as introduced hereinabove, where the resultant thyristor memory cell has a 4F2 cell size, which is suitable for high density memory applications.

As a result, the thyristor memory array thus formed includes a plurality of 3D thyristor memory cells arranged in an array, and a plurality of bit lines 360 that respectively correspond to the rows of the thyristor memory cells. Each 3D thyristor memory cell includes a semiconductor cathode (formed by the first semiconductor layer 300), a first un-doped semiconductor feature (formed by the first un-doped semiconductor layer 325) that is stacked on the semiconductor cathode, a second un-doped semiconductor feature (formed by the second un-doped semiconductor layer 330, see FIG. 12) stacked on the first un-doped semiconductor feature, a semiconductor anode (formed by the second semiconductor layer 335) stacked on the second un-doped semiconductor feature, and a gate feature disposed on and surrounding the second un-doped semiconductor feature (or the first un-doped semiconductor feature in other embodiments). The gate feature includes a gate electrode formed by the gate metal layer 350, and a gate dielectric formed by the gate dielectric layer 345. The first semiconductor layer 300 also serves as a common source line for the thyristor memory cells of the array. The gate electrodes of the thyristor memory cells in the same column are connected together to form a word line for the thyristor memory cells of the column. Each bit line 360 is electrically connected to the semiconductor anodes of those thyristor memory cells that are arranged in the corresponding row.

Figure 19:
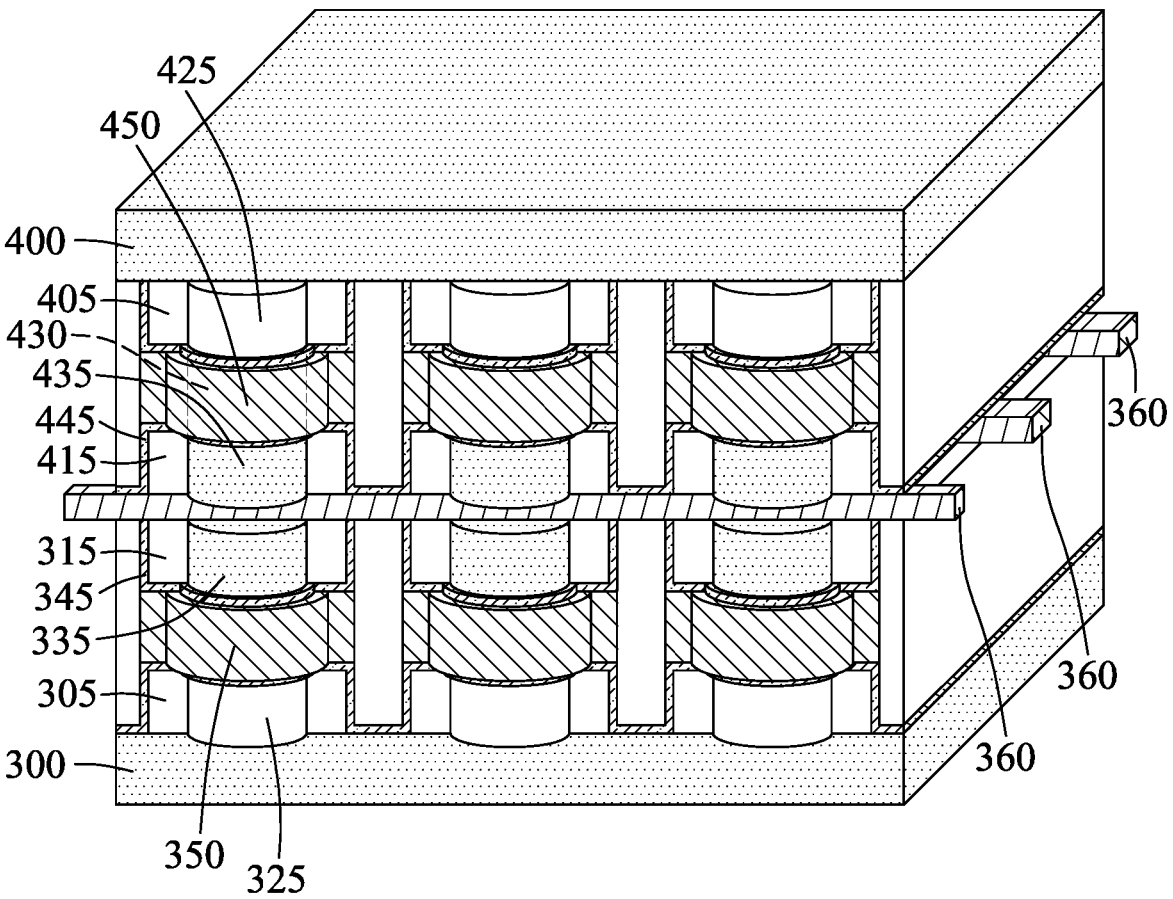
FIG. 19 is a perspective view illustrating a thyristor memory array that has a multi-stack structure in accordance with some embodiments.

Further referring to FIG. 19, the thyristor memory array may be formed into a multi-stack structure in accordance with some embodiments. In the illustrative embodiment, the thyristor memory array includes a first array of thyristor memory cells that is formed as the thyristor memory array shown in FIG. 17, and a second array of thyristor memory cells that is formed over the bit lines 360 and stacked over the first array. The second array is formed to share the bit lines 360 with the first array, and has a structure that is identical to the first array but upside down. In other words, the bottom layers of the thyristor memory cells in the second array are semiconductor anodes that are electrically connected to the bit lines 360, and the top layers of the thyristor memory cells in the second array are semiconductor cathodes that are formed in one piece to serve as a common source line for the second array.

The process flow to fabricate the second array is similar to that to fabricate the first array, and can be understood by referring to FIGS. 9-16 in cooperation with the following description, so the corresponding step-by-step drawings are omitted. After the bit lines 360 are formed in step S09 (see FIGS. 8 and 17), another dielectric stack feature (referred to as "second dielectric stack feature" hereinafter, with the dielectric feature in FIG. 9 being the first dielectric stack feature) is formed over the bit lines 360 and a dielectric layer (not shown) that the bit lines 360 are formed in. The second dielectric stack feature is formed as an upside-down stack of the layers 305, 310 and 315 as shown in FIG. 9, and includes a third dielectric layer 415, a sacrificial layer (referred to as "second sacrificial layer" hereinafter, not shown in FIG. 19) over the third dielectric layer 415, and a fourth dielectric layer 405 over the second sacrificial layer. As a result, the third dielectric layer 415 is spaced apart from the fourth dielectric layer 405 by the second sacrificial layer. The third dielectric layer 415, the second sacrificial layer and the fourth dielectric layer 405 respectively correspond to the layers 315, 310 and 305 in FIG. 9.

Then, a plurality of holes (referred to as second holes hereinafter, not shown in FIG. 19) are formed in the second dielectric stack feature, which is similar to step S02 in FIG. 8. The second holes are arranged in a second array that includes multiple columns and multiple rows, and penetrate through the fourth dielectric layer 415, the second sacrificial layer and the third dielectric layer 405. The columns of the second array are arranged in the first horizontal direction, and the rows of the second array are arranged in the second horizontal direction and respectively correspond to the bit lines 360.

Similar to step S03 in FIG. 8, a plurality of semiconductor stacks (referred to as "second semiconductor stacks" hereinafter) are subsequently formed respectively in the second holes, followed by a CMP process. Each of the second semiconductor stacks includes a third semiconductor layer 435 formed on one of the bit lines 360, a third un-doped semiconductor layer 430 over the third semiconductor layer 435, and a fourth un-doped semiconductor layer 425 stacked on the third un-doped semiconductor layer 430. The second semiconductor stacks can be deemed as upside-down semiconductor stacks comparable to the semiconductor stacks shown in FIG. 12. Accordingly, the resultant second semiconductor stacks are formed in the second dielectric stack feature.

Similar to step S04 in FIG. 8, a plurality of slits (referred to as "second slits" hereinafter) are formed in the second dielectric stack feature. The second slits are arranged in the first horizontal direction, extend in the second horizontal direction, and penetrate through the fourth dielectric layer 405, the second sacrificial layer and the third dielectric layer 415. Each second slit is disposed between adjacent two of the columns of the second array.

Similar to steps S05 to S07 in FIG. 8, the second sacrificial layer is then removed through the second slits to partly expose the second semiconductor stacks, and second gate features are formed respectively on the second semiconductor stacks through the second slits by depositing a gate dielectric layer 445, depositing a gate metal layer 450, and removing parts of the gate metal layer 450 that are disposed on sidewalls and at the bottoms of the second slits. Similar to step S08 in FIG. 8, a dielectric layer is subsequently deposited to fill up the second slits, followed by a CMP process.

After the second slits are filled, a fourth semiconductor layer 400 is formed over the fourth dielectric layer 405 and the fourth un-doped semiconductor layers 425 of the second semiconductor stacks using, for example, selective epitaxy with in-situ doping, other suitable techniques, or any combination thereof.

As a result, the second array thus formed includes a plurality of 3D thyristor memory cells arranged in columns and rows, where the rows respectively correspond to the bit lines 360. Each 3D thyristor memory cell in the second array includes a semiconductor cathode, a first un-doped semiconductor feature, a second un-doped semiconductor feature and a semiconductor anode that are stacked from top to bottom, and a gate feature disposed on and surrounding the second un-doped semiconductor feature (or the first un-doped semiconductor feature in other embodiments), where the semiconductor anode is formed by the third semiconductor layer 435, the second un-doped semiconductor feature is formed by the third un-doped semiconductor layer 430 and is stacked on the semiconductor anode, the first un-doped semiconductor feature is formed by the fourth un-doped semiconductor layer 425 and is stacked on the second un-doped semiconductor feature, and the semiconductor cathode is formed by the fourth semiconductor layer 400 and is stacked on the first un-doped semiconductor feature. The gate feature includes a gate electrode formed by the gate metal layer 450, and a gate dielectric formed by the gate dielectric layer 445. The fourth semiconductor layer 400 also serves as a common source line for the thyristor memory cells in the second array. The gate electrodes of the thyristor memory cells in the same column of the second array are connected together to form a word line for the thyristor memory cells of the column. Each bit line 360 is electrically connected to the semiconductor anodes of those thyristor memory cells that are arranged in the corresponding row of the second array.

In accordance with some embodiments, the second un-doped semiconductor layers 330 of the semiconductor stacks in the first array and the third un-doped semiconductor layers 430 of the semiconductor stacks in the second array are made of the same material; the first un-doped semiconductor layers 325 of the semiconductor stacks in the first array and the fourth un-doped semiconductor layers 425 of the semiconductor stacks in the second array are made of the same material; the second semiconductor layers 335 of the semiconductor stacks in the first array and the third semiconductor layers 435 of the semiconductor stacks in the second array are made of the same material, and the fourth semiconductor layer 400 and the first semiconductor layer 300 are made of the same material. In such a configuration, the thyristor memory cells in the first array and the thyristor memory cells in the second array may have the same electrical properties, which makes control easier.

It is noted that more stacks of arrays of thyristor memory cells may be formed by repeating the process for fabricating the first array and/or the second array, and details thereof are omitted herein for the sake of brevity.

Figure 20:
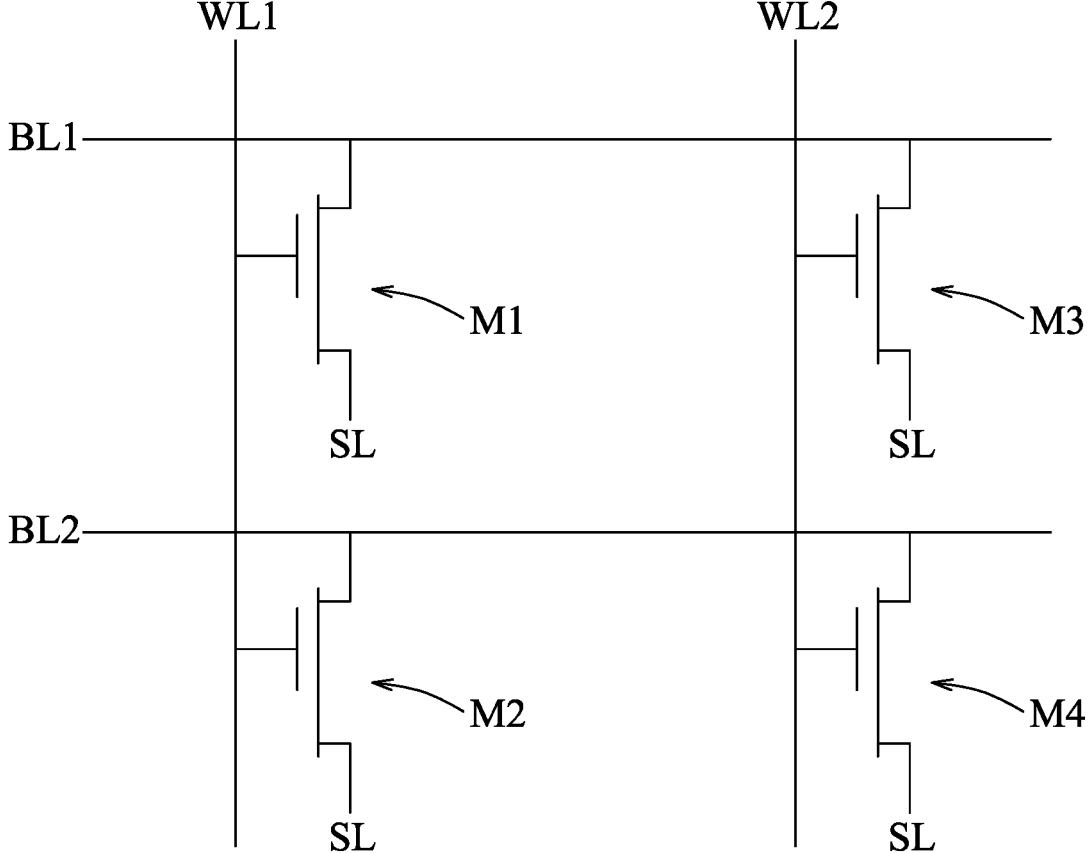
FIG. 20 is a schematic circuit diagram illustrating a thyristor memory array in accordance with some embodiments.

FIG. 20 exemplarily illustrates a thyristor memory array including thyristor memory cells M1, M2, M3 and M4 that are connected to a grounded common source line SL. The thyristor memory cell M1 is electrically connected to a bit line BL1 and a word line WL1; the thyristor memory cell M2 is electrically connected to a bit line BL2 and the word line WL1; the thyristor memory cell M3 is electrically connected to the bit line BL1 and a word line WL2; and the thyristor memory cell M4 is electrically connected to the bit line BL2 and the word line WL2.

In one example, when the thyristor memory cell M1 is to be written in with logic data "1" and the thyristor memory cell M2 is to be written in with logic data "0" at the same time, the thyristor memory cells M1, M2 are to respectively operate in region I and region III as illustrated in FIG. 2, by, for example, providing a logic high voltage (e.g., a power supply voltage Vdd) to the bit line BL1 and providing a logic low voltage (e.g., a ground voltage) to the bit line BL2, with a negative voltage (e.g., −Vdd/2) being provided to the word line WL1, while the thyristor memory cells M3 and M4 operate in a data-holding state by providing a first holding voltage (e.g., Vdd) to the word line WL2.

In one example, when data stored in the thyristor memory cell M1 is to be read out, the thyristor memory cell M1 is to operate in region II as illustrated in FIG. 2 by, for example, providing the ground voltage to the word line WL1 and providing a voltage of Vdd/2 to the bit line BL1, and then the data stored in the thyristor memory cell M1 can be determined by measuring a current flowing through the bit line BL1, while the thyristor memory cells M2, M3 and M4 operate in the data-holding state. In this case, since the ground voltage is provided to the word line WL1 in order to read out the data stored in the thyristor memory cell M1, the bit line BL2 is provided with the ground voltage to operate the thyristor memory cell M2 in the data-holding state; and since the bit line BL1 is provided with a voltage of Vdd/2 and the bit line BL2 is provided with the grounded voltage, the word line WL2 is provided with a voltage of Vdd/2 in order to operate the thyristor memory cells M3 and M4 in the data-holding state.

In accordance with some embodiments, a thyristor memory cell is provided to include a semiconductor cathode, a first un-doped semiconductor feature that is connected to the semiconductor cathode, a second un-doped semiconductor feature that is connected to the first un-doped semiconductor feature, a semiconductor anode that is connected to the second un-doped semiconductor feature, and a gate feature that is disposed on one of the first un-doped semiconductor feature and the second un-doped semiconductor feature. A bottom edge of a conduction band of the semiconductor anode is higher than a bottom edge of a conduction band of the first un-doped semiconductor feature, which is higher than a bottom edge of a conduction band of the second un-doped semiconductor feature, which is higher than a bottom edge of a conduction band of the semiconductor cathode. A top edge of a valence band of the semiconductor anode is higher than a top edge of a valence band of the first un-doped semiconductor feature, which is higher than a top edge of a valence band of the second un-doped semiconductor feature, which is higher than a top edge of a valence band of the semiconductor cathode.

In accordance with some embodiments, the gate feature surrounds the one of the first un-doped semiconductor feature and the second un-doped semiconductor feature.

In accordance with some embodiments, one of the semiconductor anode and the semiconductor cathode is spaced apart from the semiconductor substrate.

In accordance with some embodiments, the semiconductor cathode, the first un-doped semiconductor feature, the second un-doped semiconductor feature and the semiconductor anode are stacked together in a direction perpendicular to a surface of the semiconductor substrate.

In accordance with some embodiments, the semiconductor cathode is made of an N-doped material whose base material is same as a material that forms the second un-doped semiconductor feature.

In accordance with some embodiments, the semiconductor anode is made of a P-doped material whose base material is same as a material that forms the first un-doped semiconductor feature.

In accordance with some embodiments, the semiconductor anode is made of a P-doped material whose base material is same as a material that forms the first un-doped semiconductor feature.

In accordance with some embodiments, the first un-doped semiconductor feature and the second un-doped semiconductor feature are made of different group IV semiconductors.

In accordance with some embodiments, the first un-doped semiconductor feature and the second un-doped semiconductor feature are made of different group III-V semiconductors.

In accordance with some embodiments, a thyristor memory array is provided to include a plurality of first thyristor memory cells arranged in a first array that includes multiple columns and multiple rows. The columns are arranged in a first direction, and the rows are arranged in a second direction that is perpendicular to the first direction. Each of the first thyristor memory cells includes a semiconductor cathode, a first un-doped semiconductor feature, a second un-doped semiconductor feature, a semiconductor anode and a gate feature. The first un-doped semiconductor feature is stacked on the semiconductor cathode in a third direction which is perpendicular to the first direction and the second direction. The second un-doped semiconductor feature is stacked on the first un-doped semiconductor feature in the third direction. The semiconductor anode is stacked on the second un-doped semiconductor feature in the third direction. The gate feature is disposed on one of the first un-doped semiconductor feature and the second un-doped semiconductor feature. A bottom edge of a conduction band of the semiconductor anode is higher than a bottom edge of a conduction band of the first un-doped semiconductor feature, which is higher than a bottom edge of a conduction band of the second un-doped semiconductor feature, which is higher than a bottom edge of a conduction band of the semiconductor cathode. A top edge of a valence band of the semiconductor anode is higher than a top edge of a valence band of the first un-doped semiconductor feature, which is higher than a top edge of a valence band of the second un-doped semiconductor feature, which is higher than a top edge of a valence band of the semiconductor cathode.

In accordance with some embodiments, the thyristor memory array further includes a plurality of bit lines that extend in the first direction and that respectively correspond to the rows of the first array. Each of the bit lines is electrically connected to the semiconductor anodes of those of the first thyristor memory cells that are in the corresponding one of the rows.

In accordance with some embodiments, for each of the columns, the gate features of the first thyristor memory cells in the column are electrically connected to each other. The semiconductor cathodes of the first thyristor memory cells are electrically connected together.

In accordance with some embodiments, the thyristor memory array further includes a plurality of second thyristor memory cells arranged in a second array that includes multiple columns and multiple rows. The columns of the second array are arranged in the first direction, and the rows of the second array are arranged in the second direction. The second array are stacked over the first array.

In accordance with some embodiments, each of the second thyristor memory cells includes a semiconductor anode, a first un-doped semiconductor feature, a second un-doped semiconductor feature, a semiconductor cathode and a gate feature. For each of the second thyristor memory cells, the second un-doped semiconductor feature of the second thyristor memory cell is stacked on the semiconductor anode of the second thyristor memory cell in the third direction; the first un-doped semiconductor feature of the second thyristor memory cell is stacked on the second un-doped semiconductor feature of the second thyristor memory cell in the third direction; the semiconductor cathode of the second thyristor memory cell is stacked on the first un-doped semiconductor feature of the second thyristor memory cell in the third direction; and the gate feature of the second thyristor memory cell is disposed on one of the first un-doped semiconductor feature and the second un-doped semiconductor feature of the second thyristor memory cell. A bottom edge of a conduction band of the semiconductor anode of the second thyristor memory cell is higher than a bottom edge of a conduction band of the first un-doped semiconductor feature of the second thyristor memory cell, which is higher than a bottom edge of a conduction band of the second un-doped semiconductor feature of the second thyristor memory cell, which is higher than a bottom edge of a conduction band of the semiconductor cathode of the second thyristor memory cell. A top edge of a valence band of the semiconductor anode of the second thyristor memory cell is higher than a top edge of a valence band of the first un-doped semiconductor feature of the second thyristor memory cell, which is higher than a top edge of a valence band of the second un-doped semiconductor feature of the second thyristor memory cell, which is higher than a top edge of a valence band of the semiconductor cathode of the second thyristor memory cell.

In accordance with some embodiments, the first un-doped semiconductor feature of the first thyristor memory cell and the first un-doped semiconductor feature of the second thyristor memory cell are made of a same material. The second un-doped semiconductor feature of the first thyristor memory cell and the second un-doped semiconductor feature of the second thyristor memory cell are made of a same material.

In accordance with some embodiments, the rows of the second array respectively correspond to the bit lines. Each of the bit lines is electrically connected to the semiconductor anodes of those of the second thyristor memory cells that are in the corresponding one of the rows of the second array.

In accordance with some embodiments, a method is provided for fabricating a thyristor memory array. In one step, a first stack feature is formed to include a first semiconductor layer, a first dielectric layer over the first semiconductor layer, a first sacrificial layer over the first semiconductor layer, and a second dielectric layer stacked over the first sacrificial layer and the first dielectric layer. In one step, a plurality of first holes are formed in the first stack feature. The first holes are arranged in a first array that includes multiple columns and multiple rows, and penetrate through the second dielectric layer, the first sacrificial layer and the first dielectric layer. The columns are arranged in a first direction, and the rows are arranged in a second direction that is perpendicular to the first direction. In one step, a plurality of first semiconductor stacks are formed respectively in the first holes. Each of the first semiconductor stacks includes a first un-doped semiconductor layer stacked on the first semiconductor layer, a second un-doped semiconductor layer stacked on the first un-doped semiconductor layer, and a second semiconductor layer stacked on the second un-doped semiconductor layer. In one step, a plurality of first slits are formed in the first stack feature. Each of the first slits is arranged in the first direction, extends in the second direction, penetrates through at least the second dielectric layer and the first sacrificial layer, and is disposed between adjacent two of the columns of the first array. In one step, the first sacrificial layer is removed through the first slits to partly expose the first semiconductor stacks. In one step, a first gate feature is formed on each of the first semiconductor stacks through the first slits. A bottom edge of a conduction band of the second semiconductor layer is higher than a bottom edge of a conduction band of the first un-doped semiconductor layer, which is higher than a bottom edge of a conduction band of the second un-doped semiconductor layer, which is higher than a bottom edge of a conduction band of the first semiconductor layer. A top edge of a valence band of the second semiconductor layer is higher than a top edge of a valence band of the first un-doped semiconductor layer, which is higher than a top edge of a valence band of the second un-doped semiconductor layer, which is higher than a top edge of a valence band of the first semiconductor layer.

In accordance with some embodiments, in one step, a plurality of bit lines are formed over the second dielectric layer and the second semiconductor layers of the first semiconductor stacks. The bit lines extend in the first direction and respectively correspond to the rows of the first array. Each of the bit lines is electrically connected to the second semiconductor layers of some of the first semiconductor stacks that are formed in those of the first holes in the corresponding one of the rows of the first array.

In accordance with some embodiments, in one step, a second stack feature is formed over the bit lines. The second stack feature includes multiple dielectric layers. In one step, a plurality of second semiconductor stacks are formed in the second stack feature. The second semiconductor stacks are arranged in a second array that includes multiple columns and multiple rows. Each of the second semiconductor stacks penetrates through the second stack feature, and includes a third semiconductor layer formed on one of the bit lines, a third un-doped semiconductor layer over the third semiconductor layer, and a fourth un-doped semiconductor layer stacked on the third un-doped semiconductor layer. The columns of the second array are arranged in the first direction, and the rows of the second array are arranged in the second direction and respectively correspond to the bit lines. In one step, a second gate feature is formed on each of the second semiconductor stacks. In one step, a fourth semiconductor layer is formed over the second stack feature and the fourth un-doped semiconductor layers of the second semiconductor stacks. A bottom edge of a conduction band of the third semiconductor layer is higher than a bottom edge of a conduction band of the fourth un-doped semiconductor layer, which is higher than a bottom edge of a conduction band of the third un-doped semiconductor layer, which is higher than a bottom edge of a conduction band of the fourth semiconductor layer. A top edge of a valence band of the third semiconductor layer is higher than a top edge of a valence band of the fourth un-doped semiconductor layer, which is higher than a top edge of a valence band of the third un-doped semiconductor layer, which is higher than a top edge of a valence band of the fourth semiconductor layer.

In accordance with some embodiments, the second un-doped semiconductor layers of the first semiconductor stacks and the third un-doped semiconductor layers of the second semiconductor stacks are made of a same material.

The first un-doped semiconductor layers of the first semiconductor stacks and the fourth un-doped semiconductor layers of the second semiconductor stacks are made of a same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thyristor memory cell, comprising:
a semiconductor cathode;
a first un-doped semiconductor feature that is connected to the semiconductor cathode;
a second un-doped semiconductor feature that is connected to the first un-doped semiconductor feature;
a semiconductor anode that is connected to the second un-doped semiconductor feature; and
a gate feature that is disposed on one of the first un-doped semiconductor feature and the second un-doped semiconductor feature;
wherein a bottom edge of a conduction band of the semiconductor anode is higher than a bottom edge of a conduction band of the first un-doped semiconductor feature, which is higher than a bottom edge of a conduction band of the second un-doped semiconductor feature, which is higher than a bottom edge of a conduction band of the semiconductor cathode;
wherein a top edge of a valence band of the semiconductor anode is higher than a top edge of a valence band of the first un-doped semiconductor feature, which is higher than a top edge of a valence band of the second un-doped semiconductor feature, which is higher than a top edge of a valence band of the semiconductor cathode; and
wherein the gate feature surrounds the one of the first un-doped semiconductor feature and the second un-doped semiconductor feature.

2. The thyristor memory cell according to claim 1, wherein one of the semiconductor anode and the semiconductor cathode is spaced apart from a semiconductor substrate.

3. The thyristor memory cell according to claim 2, wherein the semiconductor cathode, the first un-doped semiconductor feature, the second un-doped semiconductor feature and the semiconductor anode are stacked together in a direction perpendicular to a surface of the semiconductor substrate.

4. The thyristor memory cell according to claim 1, wherein the semiconductor cathode is made of an N-doped material whose base material is same as a material that forms the second un-doped semiconductor feature.

5. The thyristor memory cell according to claim 4, wherein the semiconductor anode is made of a P-doped material whose base material is a group III-V semiconductor, which is same as a material that forms the first un-doped semiconductor feature.

6. The thyristor memory cell according to claim 1, wherein the semiconductor anode is made of a P-doped material whose base material is a group III-V semiconductor, which is same as a material that forms the first un-doped semiconductor feature.

7. The thyristor memory cell according to claim 1, wherein the semiconductor cathode is made of an N-doped material whose base material is Si, the first un-doped semiconductor feature is made of SiGe, the second un-doped semiconductor feature is made of Si, and the semiconductor anode is made of a P-doped material whose base material is SiGe.

8. The thyristor memory cell according to claim 1, wherein the first un-doped semiconductor feature and the second un-doped semiconductor feature are made of different group III-V semiconductors.

9. The thyristor memory cell according to claim 1, wherein the semiconductor cathode is made of an N-doped material whose base material is InAs, the first un-doped semiconductor feature is made of InAsSb, the second un-doped semiconductor feature is made of InAs, and the semiconductor anode is made of a P-doped material whose base material is InAsSb.

10. The thyristor memory cell according to claim 1, wherein the semiconductor cathode is made of an N-doped material whose base material is InP, the first un-doped semiconductor feature is made of GaAsSb, the second un-doped semiconductor feature is made of InP, and the semiconductor anode is made of a P-doped material whose base material is GaAsSb.

11. The thyristor memory cell according to claim 1, wherein the gate feature surrounds the second un-doped semiconductor feature.

12. A thyristor memory array, comprising:
a plurality of first thyristor memory cells arranged in a first array that includes multiple columns and multiple rows, wherein the columns are arranged in a first direction, and the rows are arranged in a second direction that is perpendicular to the first direction; and
a plurality of second thyristor memory cells arranged in a second array that is stacked over the first array and that includes multiple columns and multiple rows, wherein the columns of the second array are arranged in the first direction, and the rows of the second array are arranged in the second direction;
wherein each of the first thyristor memory cells includes:
a semiconductor cathode;
a first un-doped semiconductor feature that is stacked on the semiconductor cathode in a third direction which is perpendicular to the first direction and the second direction;
a second un-doped semiconductor feature that is stacked on the first un-doped semiconductor feature in the third direction;
a semiconductor anode that is stacked on the second un-doped semiconductor feature in the third direction; and
a gate feature that is disposed on one of the first un-doped semiconductor feature and the second un-doped semiconductor feature;
wherein a bottom edge of a conduction band of the semiconductor anode is higher than a bottom edge of a conduction band of the first un-doped semiconductor feature, which is higher than a bottom edge of a conduction band of the second un-doped semiconductor feature, which is higher than a bottom edge of a conduction band of the semiconductor cathode;
wherein a top edge of a valence band of the semiconductor anode is higher than a top edge of a valence band of the first un-doped semiconductor feature, which is higher than a top edge of a valence band of the second un-doped semiconductor feature, which is higher than a top edge of a valence band of the semiconductor cathode;

wherein each of the second thyristor memory cells includes a semiconductor anode, a first un-doped semiconductor feature, a second un-doped semiconductor feature, a semiconductor cathode and a gate feature;

wherein, for each of the second thyristor memory cells:

the second un-doped semiconductor feature of the second thyristor memory cell is stacked on the semiconductor anode of the second thyristor memory cell in the third direction;

the first un-doped semiconductor feature of the second thyristor memory cell is stacked on the second un-doped semiconductor feature of the second thyristor memory cell in the third direction;

the semiconductor cathode of the second thyristor memory cell is stacked on the first un-doped semiconductor feature of the second thyristor memory cell in the third direction; and the gate feature of the second thyristor memory cell is disposed on one of the first un-doped semiconductor feature and the second un-doped semiconductor feature of the second thyristor memory cell;

wherein a bottom edge of a conduction band of the semiconductor anode of the second thyristor memory cell is higher than a bottom edge of a conduction band of the first un-doped semiconductor feature of the second thyristor memory cell, which is higher than a bottom edge of a conduction band of the second un-doped semiconductor feature of the second thyristor memory cell, which is higher than a bottom edge of a conduction band of the semiconductor cathode of the second thyristor memory cell; and wherein a top edge of a valence band of the semiconductor anode of the second thyristor memory cell is higher than a top edge of a valence band of the first un-doped semiconductor feature of the second thyristor memory cell, which is higher than a top edge of a valence band of the second un-doped semiconductor feature of the second thyristor memory cell, which is higher than a top edge of a valence band of the semiconductor cathode of the second thyristor memory cell.

13. The thyristor memory array according to claim 12, further comprising a plurality of bit lines that extend in the first direction and that respectively correspond to the rows of the first array;

wherein each of the bit lines is electrically connected to the semiconductor anodes of those of the first thyristor memory cells that are in the corresponding one of the rows.

14. The thyristor memory array according to claim 13, wherein, for each of the columns, the gate features of the first thyristor memory cells in the column are electrically connected to each other; and wherein the semiconductor cathodes of the first thyristor memory cells are electrically connected together.

15. The thyristor memory array according to claim 12, wherein the first un-doped semiconductor feature of the first thyristor memory cell and the first un-doped semiconductor feature of the second thyristor memory cell are made of a same material; and wherein the second un-doped semiconductor feature of the first thyristor memory cell and the second un-doped semiconductor feature of the second thyristor memory cell are made of a same material.

16. The thyristor memory array according to claim 13, wherein the rows of the second array respectively correspond to the bit lines; and wherein each of the bit lines is electrically connected to the semiconductor anodes of those of the second thyristor memory cells that are in the corresponding one of the rows of the second array.

17. A method for fabricating a thyristor memory array, comprising steps of:

forming a first stack feature that includes a first semiconductor layer, a first dielectric layer over the first semiconductor layer, a first sacrificial layer over the first semiconductor layer, and a second dielectric layer stacked over the first sacrificial layer and the first dielectric layer;

forming a plurality of first holes in the first stack feature, the first holes being arranged in a first array that includes multiple columns and multiple rows, and penetrating through the second dielectric layer, the first sacrificial layer and the first dielectric layer, wherein the columns are arranged in a first direction, and the rows are arranged in a second direction that is perpendicular to the first direction;

forming a plurality of first semiconductor stacks respectively in the first holes, each of the first semiconductor stacks including a first un-doped semiconductor layer stacked on the first semiconductor layer, a second un-doped semiconductor layer stacked on the first un-doped semiconductor layer, and a second semiconductor layer stacked on the second un-doped semiconductor layer;

forming a plurality of first slits in the first stack feature, each of the first slits being arranged in the first direction, extending in the second direction, penetrating through at least the second dielectric layer and the first sacrificial layer, and being disposed between adjacent two of the columns of the first array;

removing the first sacrificial layer through the first slits to partly expose the first semiconductor stacks; and forming a first gate feature on each of the first semiconductor stacks through the first slits;

wherein a bottom edge of a conduction band of the second semiconductor layer is higher than a bottom edge of a conduction band of the first un-doped semiconductor layer, which is higher than a bottom edge of a conduction band of the second un-doped semiconductor layer, which is higher than a bottom edge of a conduction band of the first semiconductor layer; and wherein a top edge of a valence band of the second semiconductor layer is higher than a top edge of a valence band of the first un-doped semiconductor layer, which is higher than a top edge of a valence band of the second un-doped semiconductor layer, which is higher than a top edge of a valence band of the first semiconductor layer.

18. The method according to claim 17, further comprising a step of:

forming a plurality of bit lines over the second dielectric layer and the second semiconductor layers of the first semiconductor stacks;

wherein the bit lines extend in the first direction and respectively correspond to the rows of the first array; and wherein each of the bit lines is electrically connected to the second semiconductor layers of some of the first semiconductor stacks that are formed in those of the first holes in the corresponding one of the rows of the first array.

19. The method according to claim 18, further comprising steps of:

forming a second stack feature over the bit lines, the second stack feature including multiple dielectric layers;

forming a plurality of second semiconductor stacks in the second stack feature, the second semiconductor stacks being arranged in a second array that includes multiple columns and multiple rows, each of the second semiconductor stacks penetrating through the second stack feature, and including a third semiconductor layer formed on one of the bit lines, a third un-doped semiconductor layer over the third semiconductor layer, and a fourth un-doped semiconductor layer stacked on the third un-doped semiconductor layer, wherein the columns of the second array are arranged in the first direction, and the rows of the second array are arranged in the second direction and respectively correspond to the bit lines;

forming a second gate feature on each of the second semiconductor stacks; and forming a fourth semiconductor layer over the second stack feature and the fourth un-doped semiconductor layers of the second semiconductor stacks;

wherein a bottom edge of a conduction band of the third semiconductor layer is higher than a bottom edge of a conduction band of the fourth un-doped semiconductor layer, which is higher than a bottom edge of a conduction band of the third un-doped semiconductor layer, which is higher than a bottom edge of a conduction band of the fourth semiconductor layer; and wherein a top edge of a valence band of the third semiconductor layer is higher than a top edge of a valence band of the fourth un-doped semiconductor layer, which is higher than a top edge of a valence band of the third un-doped semiconductor layer, which is higher than a top edge of a valence band of the fourth semiconductor layer.

20. The method according to claim 19, wherein the second un-doped semiconductor layers of the first semiconductor stacks and the third un-doped semiconductor layers of the second semiconductor stacks are made of a same material; and wherein the first un-doped semiconductor layers of the first semiconductor stacks and the fourth un-doped semiconductor layers of the second semiconductor stacks are made of a same material.

* * * * *